(12) United States Patent
Kim et al.

(10) Patent No.: US 11,705,503 B2
(45) Date of Patent: Jul. 18, 2023

(54) SEMICONDUCTOR DEVICE INCLUDING NON-SACRIFICIAL GATE SPACERS AND METHOD OF FABRICATING THE SAME

(71) Applicants: Samsung Electronics Co., Ltd., Suwon-si (KR); Research & Business Foundation Sungkyunkwan University, Suwon-si (KR)

(72) Inventors: Jin Bum Kim, Seoul (KR); MunHyeon Kim, Hwaseong-si (KR); Hyoung Sub Kim, Seoul (KR); Tae Jin Park, Yongin-si (KR); Kwan Heum Lee, Suwon-si (KR); Chang Woo Noh, Hwaseong-si (KR); Maria Toledano Lu Que, Hwaseong-si (KR); Hong Bae Park, Seoul (KR); Si Hyung Lee, Hwaseong-si (KR); Sung Man Whang, Yongin-si (KR)

(73) Assignees: SAMSUNG ELECTRONICS CO., LTD.; RESEARCH & BUSINESS FOUNDATION SUNGKYUNKWAN UNIVERSITY

( * ) Notice: Subject to any disclaimer, the term of this patent is extended or adjusted under 35 U.S.C. 154(b) by 0 days.

(21) Appl. No.: 17/038,004

(22) Filed: Sep. 30, 2020

(65) Prior Publication Data

US 2021/0013324 A1 Jan. 14, 2021

Related U.S. Application Data

(62) Division of application No. 16/037,922, filed on Jul. 17, 2018, now abandoned.

(30) Foreign Application Priority Data

Dec. 27, 2017 (KR) .......................... 10-2017-0180511

(51) Int. Cl.
H01L 29/66 (2006.01)
H01L 29/423 (2006.01)
(Continued)

(52) U.S. Cl.
CPC .. H01L 29/66545 (2013.01); H01L 29/42392 (2013.01); H01L 29/6656 (2013.01);
(Continued)

(58) Field of Classification Search
CPC ......... H01L 29/66545; H01L 29/66553; H01L 29/6656; H01L 29/42392; H01L 29/66795
See application file for complete search history.

(56) References Cited

U.S. PATENT DOCUMENTS 7,274,051 B2 9/2007 Kim et al.
8,921,939 B2 12/2014 Johnson et al.
(Continued)

FOREIGN PATENT DOCUMENTS

JP 2011029503 A 2/2011
KR 20170097322 A 8/2017

OTHER PUBLICATIONS

"Written Decision on Registration", KR Application No. 10-2017-0180511, dated Nov. 21, 2022, 5 pp.

*Primary Examiner* — Phat X Cao
(74) *Attorney, Agent, or Firm* — Myers Bigel, P.A.

(57) ABSTRACT

A semiconductor device includes a substrate, a gate electrode on the substrate, a gate spacer on a sidewall of the gate electrode, an active pattern penetrating the gate electrode and the gate spacer, and an epitaxial pattern contacting the active pattern and the gate spacer. The gate electrode extends in a first direction. The gate spacer includes a semiconductor material layer. The active pattern extends in a second direction crossing the first direction.

18 Claims, 30 Drawing Sheets

(51) Int. Cl.
  *H01L 29/78*    (2006.01)
  *H01L 29/786*   (2006.01)

(52) U.S. Cl.
  CPC .. *H01L 29/66439* (2013.01); *H01L 29/66636* (2013.01); *H01L 29/66795* (2013.01); *H01L 29/7848* (2013.01); *H01L 29/78696* (2013.01)

(56) References Cited

U.S. PATENT DOCUMENTS

| | | |
|---|---|---|
| 9,064,944 B2 | 6/2015 | Kim et al. |
| 9,343,300 B1 | 5/2016 | Jacob et al. |
| 9,425,298 B2 | 8/2016 | Carta et al. |
| 9,502,518 B2 | 11/2016 | Liu et al. |
| 9,570,609 B2 | 2/2017 | Obradovic et al. |
| 9,577,100 B2 | 2/2017 | Cheng et al. |
| 9,614,060 B2 | 4/2017 | Kim et al. |
| 9,647,098 B2 | 5/2017 | Obradovic et al. |
| 9,653,547 B1 | 5/2017 | Chang et al. |
| 9,704,863 B1 | 7/2017 | Cheng et al. |
| 9,755,017 B1 | 9/2017 | Guillorn et al. |
| 2014/0084249 A1 | 3/2014 | Basker et al. |
| 2016/0093739 A1* | 3/2016 | Jacob ............ H01L 21/3085 257/349 |
| 2016/0118483 A1* | 4/2016 | Flachowsky ...... H01L 29/165 257/192 |
| 2017/0141188 A1 | 5/2017 | Lee et al. |
| 2017/0154958 A1* | 6/2017 | Fung ............ H01L 29/42392 |
| 2017/0194330 A1 | 7/2017 | Lee et al. |
| 2017/0213888 A1 | 7/2017 | Chang et al. |
| 2018/0151378 A1 | 5/2018 | Huang et al. |
| 2018/0254329 A1 | 9/2018 | Guillorn et al. |
| 2019/0058053 A1 | 2/2019 | Dewey et al. |
| 2019/0067452 A1* | 2/2019 | Cheng ............ H01L 29/66666 |

\* cited by examiner

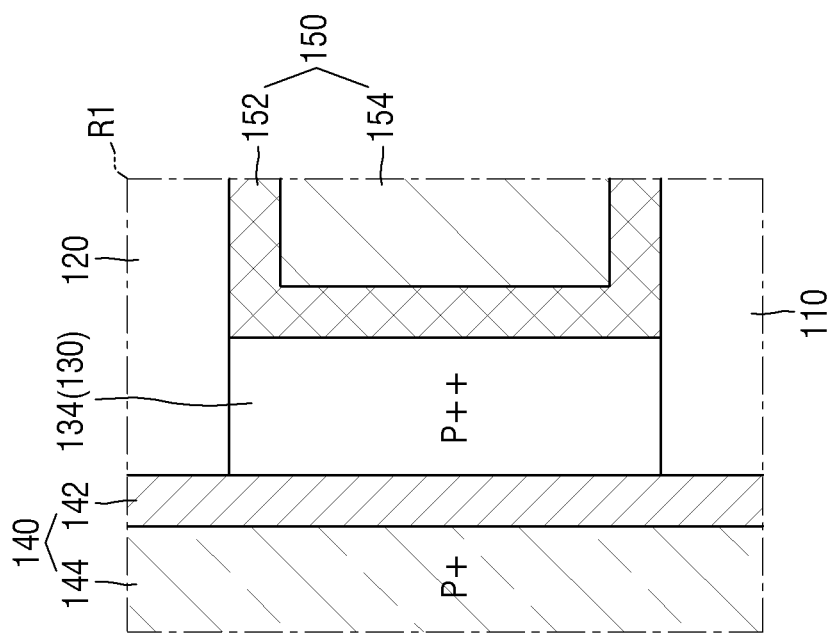

SEMICONDUCTOR DEVICE INCLUDING NON-SACRIFICIAL GATE SPACERS AND METHOD OF FABRICATING THE SAME

CROSS-REFERENCE TO RELATED APPLICATION

This application is a divisional of and claims priority to U.S. application Ser. No. 16/037,922, filed Jul. 17, 2018, which claims priority under 35 U.S.C. § 119 to Korean Patent Application No. 10-2017-0180511, filed on Dec. 27, 2017, in the Korean Intellectual Property Office, the disclosures of which are hereby incorporated by reference in their entireties.

FIELD

Example embodiments of the present disclosure relate to a semiconductor device and a method of fabricating the same, and more specifically, to a semiconductor device having a gate all around structure and a method of fabricating the same.

BACKGROUND

To increase the integration of an integrated circuit device, a multi-gate transistor including a silicon body of a fin- or nanowire-shape on a substrate and a gate on the silicon body has been proposed.

Since a multi-gate transistor can utilize a three-dimensional channel, it can be scaled. Further, current control capability of the multi-gate transistor can be improved without increasing a gate length thereof. Short channel effects (SCE), in which the electrical potential of the channel region is affected by the drain voltage, can be effectively reduced and/or suppressed in the multi-gate transistor.

SUMMARY

According to example embodiments of the inventive concepts, a semiconductor device may include a substrate, a gate electrode on the substrate, a gate spacer on a sidewall of the gate electrode, an active pattern penetrating the gate electrode and the gate spacer, and an epitaxial pattern contacting the active pattern and the gate spacer. The gate electrode may extend in a first direction. The gate spacer may include a semiconductor material layer. The active pattern may extend in a second direction crossing the first direction.

According to example embodiments of the inventive concepts, a semiconductor device may include a substrate, a first active pattern on the substrate, a gate electrode surrounding the first active pattern, an inner spacer on a sidewall of the gate electrode, and an epitaxial pattern contacting the first active pattern and the inner spacer. The inner spacer may be between the first active pattern and the substrate and include a semiconductor material.

According to example embodiments of the inventive concepts, a semiconductor device may include a substrate including a first region and a second region, a first gate electrode on the first region, a first gate spacer on a sidewall of the first gate electrode, a first active pattern penetrating the first gate electrode, a first epitaxial pattern on a sidewall of the first gate spacer, a second gate electrode on the second region, a second active pattern penetrating the second gate electrode, and a second epitaxial pattern on a side of the second gate electrode. The first gate electrode may extend in a first direction. The first gate spacer may include a first semiconductor material. The first active pattern may extend in a second direction crossing the first direction. The second gate electrode extend in a third direction. The second active pattern may extend in a fourth direction crossing the third direction.

According to example embodiments of the inventive concepts, a method of manufacturing a semiconductor device may include forming a fin structure including at least one sacrificial pattern and at least one active pattern which are alternately stacked on a substrate, selectively recess a sidewall of the at least one sacrificial pattern, forming an inner spacer layer along a sidewall of the at least one active pattern and the recessed sidewall of the at least one sacrificial pattern, forming an inner spacer on the recessed sidewall of the at least one sacrificial pattern by removing a portion of the inner spacer layer on the sidewall of the at least one active pattern, and forming an epitaxial pattern contacting the inner spacer and the at least one active pattern.

BRIEF DESCRIPTION OF THE DRAWINGS

FIGS. 3A and 3B are enlarged views of portion R1 of FIG. 2.

DETAILED DESCRIPTION

Figure 1:
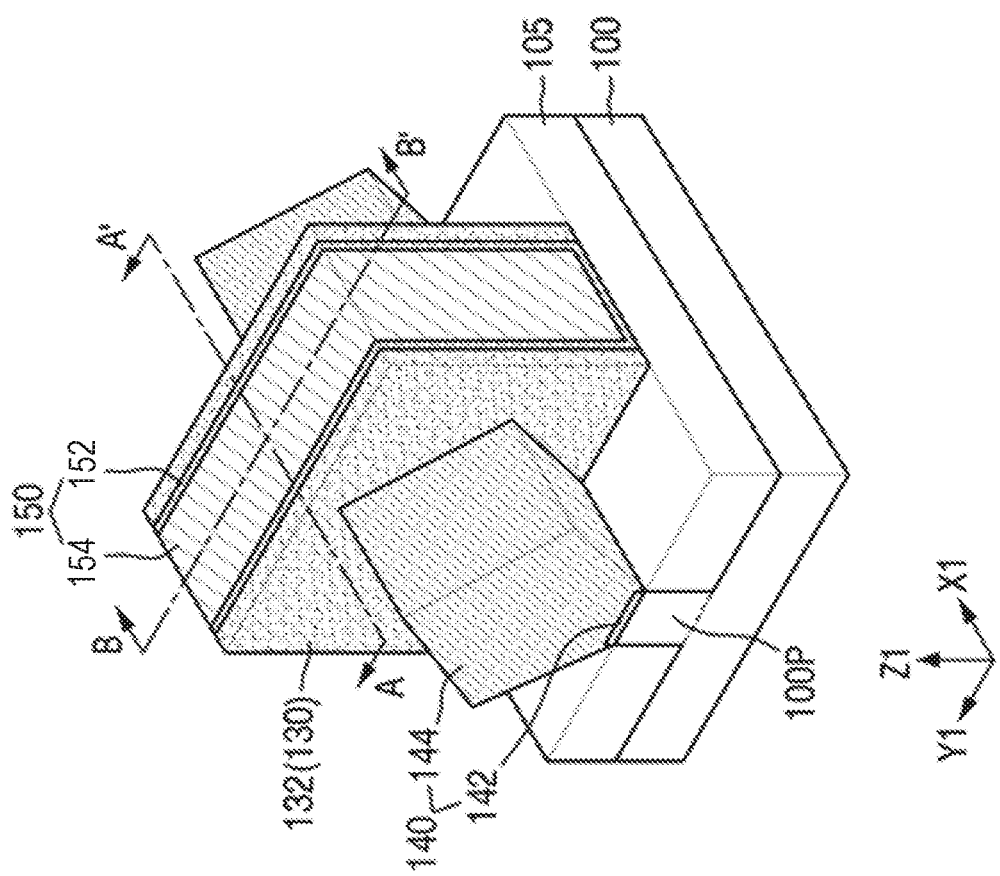
FIG. 1 is a perspective view of a semiconductor device according to example embodiments.

Various example embodiments will now be described more fully hereinafter with reference to the accompanying drawings. Like reference numerals may refer to like elements throughout this application.

Hereinafter, a semiconductor device according to example embodiments will described with reference to FIGS. 1 to 15. For convenience of explanation, a device isolation layer such as a shallow trench isolation (STI) is omitted in the drawings.

Figure 2:
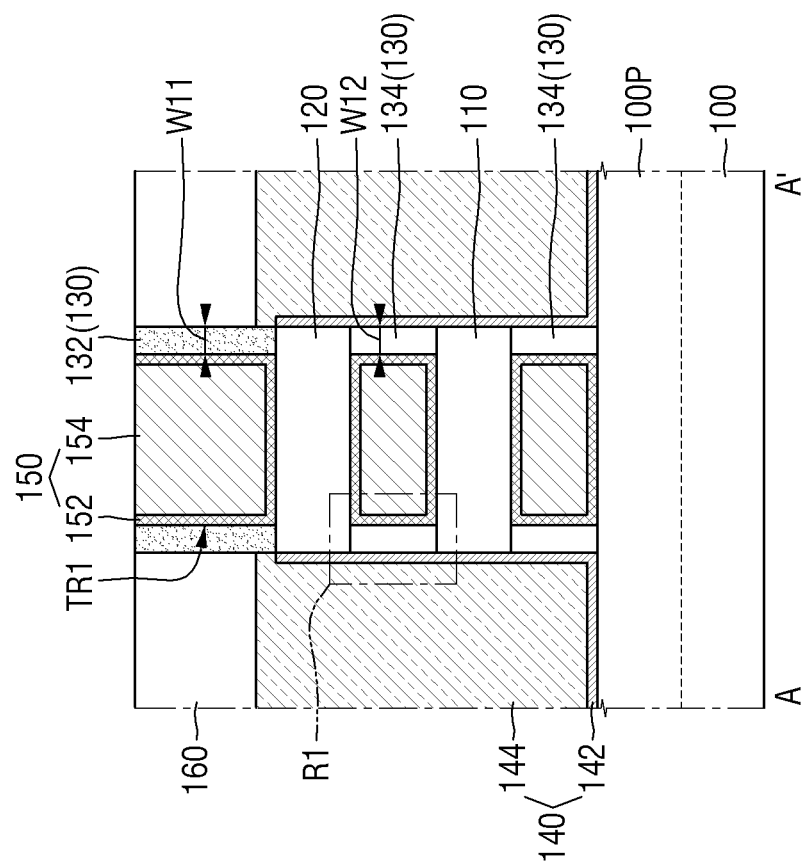
FIG. 2 is a cross-sectional view taken along line A-A' of FIG. 1.
Figure 3B:
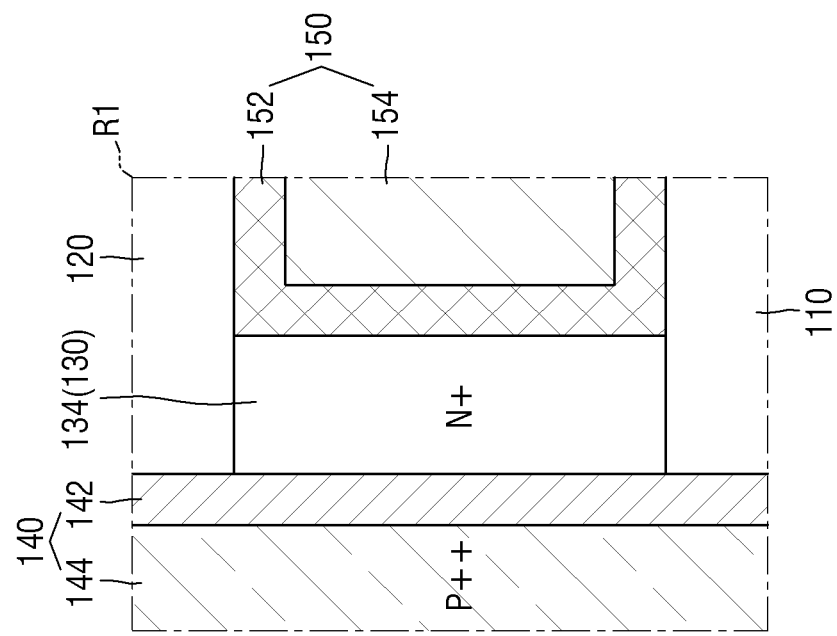
Figure 4:
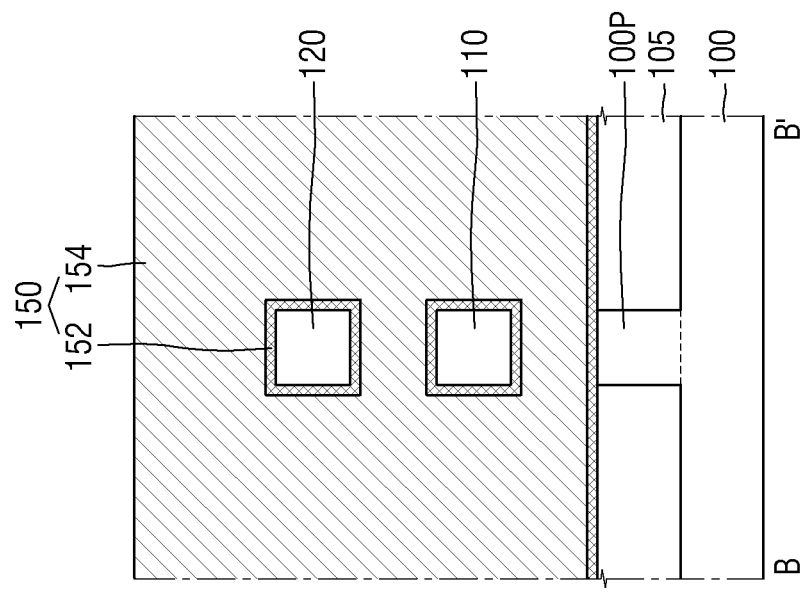
FIG. 4 is a cross-sectional view taken along line B-B' of FIG. 1.

FIG. 1 is a perspective view of a semiconductor device according to example embodiments. FIG. 2 is a cross-sectional view taken along line A-A' of FIG. 1. FIGS. 3A and 3B are enlarged views of portion R1 of FIG. 2. FIG. 4 is cross-sectional view taken along line B-B' of FIG. 1. An interlayer insulation layer 160 is not illustrated in FIG. 1, for brevity.

Referring to FIGS. 1 to 4, a semiconductor device includes a substrate 100, a field insulation layer 105, a first active pattern 110, a second active pattern 120, a first gate structure 150, first gate spacers 130, first epitaxial patterns 140, and the interlayer insulation layer 160. As used herein, the terms first, second, third, etc. are used merely to differentiate one direction, region, portion, or element from another.

The substrate 100 may include a bulk silicon substrate or a silicon on insulator (SOI) substrate. In some embodiments, the substrate 100 may include, e.g., at least one of silicon germanium, silicon germanium on insulator (SGOI), indium antimonide, lead-tellurium compound, indium arsenic, indium phosphide, gallium arsenic, or gallium antimonide. The substrate 100 may include an epitaxial layer on a base substrate. Hereinafter, it will be described that the substrate 100 includes silicon, for convenience of description.

The substrate 100 includes a first fin protrusion 100P. The first fin protrusion 100P may protrude from an upper surface of the substrate 100 and extend lengthwise in a first direction X1. Spatially relative terms, such as "beneath," "below," "lower," "above," "upper" "higher," and the like, are intended to encompass different orientations of the device in use or operation in addition to the orientation depicted in the figures. The first fin protrusion 100P may be formed by etching a portion of the substrate 100, or may be an epitaxial layer grown from the substrate 100.

The first fin protrusion 100P may include silicon or germanium. In some embodiments, the first fin protrusion 100P may include a compound semiconductor, e.g., a group IV-IV compound semiconductor or a group III-V compound semiconductor.

The group IV-IV compound semiconductor may include a binary compound or a ternary compound, each of which includes at least two of carbon (C), silicon (Si), germanium (Ge), or tin (Sn), or a compound which a group IV element is doped therein.

The group III-V compound semiconductor may include a binary compound, a ternary compound, or a quaternary compound, each of which is formed by combination of a group III element, e.g., at least one of aluminum (Al), gallium (Ga), or indium (In), and a group V element, e.g., at least one of phosphorus (P), arsenic (As), or antimony (Sb).

The field insulation layer 105 may be formed on the substrate 100. The field insulation layer 105 may surround at least a portion of a sidewall of the first fin protrusion 100P. As used herein, the term "surround" does not require completely or entirely surrounding. The first fin protrusion 100P may be defined by the field insulation layer 105.

Referring to FIG. 4, sidewalls of the first active pattern 110 and the second active pattern 120 may be partially or entirely surrounded by the field insulation layer 105. However, the inventive concepts are not limited thereto.

The field insulation layer 105 may include, e.g., a silicon oxide layer, a silicon nitride layer, a silicon oxynitride layer, or combinations thereof.

The first active pattern 110 may be formed on the substrate 100. The first active pattern 110 may be spaced apart from the substrate 100. The first active pattern 110 may extend in the first direction X1.

The first active pattern 110 may be formed on the first fin protrusion 100P and be spaced apart from the first fin protrusion 100P. The first active pattern 110 may vertically overlap the first fin protrusion 100P. For example, the first active pattern 110 may overlap the first fin protrusion 100P in a third direction Z1. Thus, the first active pattern 110 may not be formed on the field insulation layer 105, but may be formed on the first fin protrusion 100P.

The second active pattern 120 may be formed on the first active pattern 110. The second active pattern 120 may be spaced apart from the first active pattern 110. The second active pattern 120 may extend in the first direction X1. The second active pattern 120 may vertically overlap the first active pattern 110. For example, the second active pattern 120 may overlap the first active pattern 110 in the third direction Z1.

The first active pattern 110 and the second active pattern 120 may include silicon or germanium. In some embodiments, the first active pattern 110 and the second active pattern 120 may include a compound semiconductor, e.g., a group IV-IV compound semiconductor or a group III-V compound semiconductor.

The first active pattern 110 and the second active pattern 120 may include the same material as or a different material from the first fin protrusion 100P.

Each of the first active pattern 110 and the second active pattern 120 may be used as a channel region of a transistor.

Even though semiconductor devices including two active patterns are illustrated in the drawings, the inventive concepts are not limited thereto. For example, semiconductor devices may include one or more than three active patterns.

The first gate structure 150 includes a first gate insulation layer 152 and a first gate electrode 154.

The first gate electrode 154 may be formed on the substrate 100. The first gate electrode 154 may intersect the first active pattern 110 and the second active pattern 120. For example, the first gate electrode 154 may extend lengthwise in a second direction Y1.

The first gate electrode 154 may surround the first active pattern 110 and the second active pattern 120. For example, the first active pattern 110 and the second active pattern 120 may penetrate or extend through the first gate electrode 154 in the first direction X1. The first gate electrode 154 may entirely surround or otherwise extend along a perimeter of the first active pattern 110 and a perimeter of the second active pattern 120. The first gate electrode 154 may be disposed between the first active pattern 110 and the substrate 100.

The first gate electrode 154 may include a conductive material. The first gate electrode 154 may be formed of a single layer or multiple layers. For example, the first gate electrode 154 may include a work function control conductive layer and a filling conductive layer which fills a space formed by the work function control conductive layer.

The first gate electrode 154 may include, e.g., TiN, WN, TaN, Ru, TiC, TaC, Ti, Ag, Al, TiAl, TiAlN, TiAlC, TaCN, TaSiN, Mn, Zr, W, Al, or combinations thereof. In some embodiments, the first gate electrode 154 may include silicon or silicon germanium. The first gate electrode 154 may be formed by a gate replacement process, but the inventive concepts are not limited thereto.

The first gate spacers 130 may be formed on opposite sidewalls of the first gate electrode 154 and extend in the second direction Y1. The first gate spacers 130 may define a first trench TR1 crossing the first active pattern 110 and the second active pattern 120.

The first gate spacers 130 may be formed on opposite end portions of the first and second active patterns 110 and 120. For example, the first gate spacers 130 may contact the opposite end portions of the first and second active patterns 110 and 120. The term "contact" may mean that there are no intervening elements (e.g., layers or substrates) present between the contacting elements. In contrast, when an element is referred to as being "on" or "adjacent" another element, it may contact the other element, or intervening elements may also be present. In some embodiments, the first active pattern 110 and/or the second active pattern 120 may penetrate or extend through the first gate spacers 130.

Each of the first gate spacers 130 includes a first outer spacer 132 and a first inner spacer 134.

The first inner spacer 134 may be formed on a sidewall of a portion of the first gate electrode 154 that surrounds the first active pattern 110 and the second active pattern 120. The first outer spacer 132 may be formed on the first inner spacer 134. The first outer spacer 132 may be disposed on the second active pattern 120. For example, referring to FIGS. 2 and 3, the first inner spacer 134 may be disposed between the first fin protrusion 100P and the first active pattern 110. The first inner spacer 134 may also be disposed between the first active pattern 110 and the second active pattern 120.

In some embodiments, the first inner spacer 134 and the first outer spacer 132 may be disposed on the second active pattern 120, in accordance with a multi-layered stack structure for forming the first and second active patterns 110 and 120.

Referring to FIG. 2, a width of the first outer spacer 132 may be equal to a width of the first inner spacer 134. Herein, the width of the first outer spacer 132 and the width of the first inner spacer 134 refer to a first width W11 of the first outer spacer 132 and a second width W12 of the first inner spacer 134, respectively, in the first direction X1. In some embodiment, the first width W11 of the first outer spacer 132 may be less or greater than the second width W12 of the first inner spacer 134.

The first gate spacers 130 may include a material similar to the first active pattern 110 and the second active pattern 120. For example, the first gate spacers 130 may include a semiconductor material layer. The semiconductor material layer may include a semiconductor material. The semiconductor material may not include an insulating material, such as oxide or nitride. That is, the first gate spacers 130 may be free of oxides, nitrides, and/or other insulating materials.

In some embodiments, the first inner spacer 134 of each of the first gate spacers 130 may include a semiconductor material layer.

For example, when the first active pattern 110 and the second active pattern 120 include silicon, the first inner spacer 134 may include silicon (Si) or silicon germanium (SiGe). In this case, a silicon concentration in the first inner spacer 134 may be greater than that in each of the first active pattern 110 and the second active pattern 120, for example. In some embodiments, when the first active pattern 110 and the second active pattern 120 include germanium (Ge) or silicon germanium (SiGe), the first inner spacer 134 may include germanium (Ge) or silicon germanium (SiGe). In this case, a germanium concentration in the first inner spacer 134 may be greater than that in each of the first active pattern 110 and the second active pattern 120, for example.

The first outer spacer 132 may be the same material as or a different material from the first inner spacer 134.

In some embodiments, the first outer spacer 132 may include an insulating material layer. For example, the first outer spacer 132 may include silicon nitride, silicon oxynitride, silicon oxide, silcon oxycarbonitride, or combinations thereof.

The first gate insulation layer 152 may be disposed between the first active pattern 110 and the first gate electrode 154 and between the second active pattern 120 and the first gate electrode 154. Thus, the first gate insulation layer 152 may be formed along surfaces of the first active pattern 110 and the second active pattern 120. The first gate insulation layer 152 may surround the first active pattern 110 and the second active pattern 120. Additionally, the first gate insulation layer 152 may be formed on an upper surface of the field insulation layer 105 and on an upper surface of the first fin protrusion 100P.

The first gate insulation layer 152 may extend along inner sidewalls of the first gate spacers 130. For example, the first gate insulation layer 152 may extend along sidewalls and a lower surface of the first trench TR1.

The first gate insulation layer 152 may include a high-k dielectric material having a dielectric constant greater than that of silicon oxide, silicon nitride, or silicon oxynitride. For example, the first gate insulation layer 152 may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, or combinations thereof, but is not limited thereto.

Even though not shown in the drawings, an interfacial layer may be formed between the first gate insulation layer 152 and the first active pattern 110 and between the first gate insulation layer 152 and the first fin protrusion 100P. According to a method of forming the interfacial layer, the interfacial layer may be formed along a profile or periphery of the first gate insulation layer 152. However, the inventive concepts are not limited thereto.

The first epitaxial patterns 140 may be formed on opposite sides of the first gate electrode 154. The first epitaxial patterns 140 may contact the first active pattern 110, the second active pattern 120, and the first gate spacers 130. For example, the first epitaxial patterns 140 may be formed on sidewalls of the first active pattern 110, sidewalls of the second active pattern 120, and outer sidewalls of the respective first gate spacers 130.

Each of the first epitaxial patterns 140 may include an epitaxial layer formed on the first fin protrusion 100P. The first epitaxial patterns 140 may be elevated source/drain regions having upper surfaces protruding above the upper surface of the substrate 100. However, the inventive concepts are not limited thereto. The first epitaxial patterns 140 may be impurity regions formed in the substrate 100.

In some embodiments, each of the first epitaxial patterns 140 may include multiple layers. For example, each of the first epitaxial patterns 140 includes a first epitaxial layer 142 and a second epitaxial layer 144 that are sequentially formed on the substrate 100.

The first epitaxial layer 142 may be formed on the first fin protrusion 100P, the first active pattern 110, the second active pattern 120, and the first inner spacer 134. The first epitaxial layer 142 may be formed from the first fin protrusion 100P, the first active pattern 110, the second active pattern 120, and the first inner spacer 134, by an epitaxial growth process. The first epitaxial layer 142 may extend along the upper surface of the first fin protrusion 100P, the sidewall of the first active pattern 110, the sidewall of the second active pattern 120, and an outer sidewall of the first inner spacer 134.

The first epitaxial layer 142 may act as a seed to grow each of the first epitaxial patterns 140. However, in some embodiments, the first epitaxial layer 142 may be omitted.

The second epitaxial layer 144 may be formed on the first epitaxial layer 142. The second epitaxial layer 144 may be formed to fill a trench formed on the substrate 100.

The second epitaxial layer 144 may have a cross section of diamond shape, pentagonal shape, or hexagonal shape. However, the inventive concepts are not limited thereto. The second epitaxial layer 144 may have cross sections of various shapes.

In some embodiments, when the semiconductor device is a PMOS transistor, the first epitaxial patterns 140 may include a p-type impurity or an impurity for preventing diffusion of the p-type impurity. For example, the first epitaxial patterns 140 may include B, C, In, Ga, Al, or combinations thereof.

In some embodiments, when the semiconductor device is a PMOS transistor, the first epitaxial patterns 140 may include a compressive stress material, that is, a material that is configured to induce a compressive stress or strain. For example, when each of the first active pattern 110 and the second active pattern 120 is a silicon pattern, the first epitaxial patterns 140 may include a material having a lattice constant greater than that of silicon. For example, the first epitaxial patterns 140 may include silicon germanium (SiGe). The compressive stress material may apply a compressive stress to the first and second active patterns 110 and 120, such that a carrier mobility in the channel region (e.g., the first and second active patterns 110 and 120) of the transistor may be increased.

In some embodiments, when the semiconductor device is an NMOS transistor, the first epitaxial patterns 140 may include an n-type impurity or an impurity for preventing diffusion of the n-type impurity. For example, the first epitaxial patterns 140 may include P, Sb, As, or combinations thereof.

In some embodiments, when the semiconductor device is an NMOS transistor, the first epitaxial patterns 140 may include a tensile stress material, that is, a material that is configured to induce a tensile stress or strain. For example, when each of the first active pattern 110 and the second active pattern 120 is a silicon pattern, the first epitaxial patterns 140 may include a material having a lattice constant smaller than that of silicon. For example, the first epitaxial patterns 140 may include silicon carbon (SiC). The tensile stress material may apply a tensile stress to the first and second active patterns 110 and 120, such that a carrier mobility in the channel region (e.g., the first and second active patterns 110 and 120) of the transistor may be increased. In some embodiments, the first epitaxial patterns 140 may not include the tensile stress material.

In some embodiments, the first epitaxial layer 142 and the second epitaxial layer 144 may include a first semiconductor material at various concentrations. For example, when the semiconductor device is a PMOS transistor, the first epitaxial layer 142 may include the first semiconductor material, that is a compressive stress material, at a first concentration. When the first and second active patterns 110 and 120 include silicon (Si), the first semiconductor material may be, e.g., germanium (Ge).

At this time, the second epitaxial layer 144 may include the first semiconductor material at a second concentration different from the first concentration. For example, a germanium concentration in the second epitaxial layer 144 may be greater than that in the first epitaxial layer 142. The first concentration may range from 10% to 30%, and the second concentration may range from 40% to 65%. As the concentration of the first semiconductor material increases, the compressive stress imparted on the channel region (e.g., the first and second active patterns 110 and 120) of the transistor may be increased. Thus, the second epitaxial layer 144 including the first semiconductor material at the second concentration greater than the first concentration may serve to increase the carrier mobility.

In some embodiments, the first concentration may be equal to the second concentration.

In some embodiments, a portion of each of the first epitaxial patterns 140 that is adjacent to the first active pattern 110, the second active pattern 120, and the first gate spacers 130 may include a first semiconductor material at a high concentration. For example, a germanium concentration of the first epitaxial layer 142 may be more than 30%.

The interlayer insulation layer 160 may be formed on the substrate 100. The interlayer insulation layer 160 may surround the outer sidewalls of the first gate spacers 130 defining the first trench TR1.

The interlayer insulation layer 160 may include, e.g., silicon oxide, silicon nitride, silicon oynitride, and/or a low-k dielectric material. The term "and/or" includes any and all combinations of one or more of the associated listed items. The low-k dielectric material may include, e.g., Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or combinations thereof, but is not limited thereto.

In some embodiments, the first gate spacers 130 may include an impurity. For example, the first inner spacer 134 of each of the first gate spacers 130 may include a p-type impurity or an n-type impurity. That is, the first inner spacer 134 may be p-type or n-type.

The first gate spacers 130 may include an impurity of the same type as or a different type from (e.g., the same conductivity type as or a different conductivity type than) the first epitaxial patterns 140.

For example, the first epitaxial patterns 140 may include a first impurity, and the first gate spacers 130 may include a second impurity of the same conductive type as the first impurity. For example, as shown in FIG. 3A, each of the first epitaxial patterns 140 and the first inner spacer 134 may include a p-type impurity.

In this case, the first inner spacer 134 may improve the performance of the semiconductor device. For example, when the first epitaxial patterns 140 include the first impurity at a low concentration, the first inner spacer 134 may include the second impurity at a higher concentration than that of the first impurity, such that the performance of the semiconductor device may be improved. In some embodiments, the concentration of the second impurity may be substantially equal to or lower than that of the first impurity.

In some embodiments, the first epitaxial patterns 140 may include a first impurity, and the first gate spacers 130 may include a second impurity of a different type from the first impurity. For example, as shown in FIG. 3B, the first epitaxial patterns 140 may include a p-type impurity, and the first inner spacer 134 may include an n-type impurity.

In this case, the first inner spacer 134 may effectively suppress a short channel effect (SCE). For example, when the first epitaxial patterns 140 include the first impurity at a high concentration, the first impurity may be diffused into the channel region (e.g., the first active pattern 110 and the second active pattern 120), such that the SCE may intensify. However, the second impurity having the different conductive type from the first impurity may be diffused into the first active pattern 110 and the second active pattern 120 adjacent thereto, the SCE may be effectively suppressed.

In semiconductor devices according to example embodiments, defects in the source/drain region may be reduced or prevented from occurring. For example, a stacking fault in the source/drain region may be reduced or prevented from occurring.

The source/drain region may be formed from the active pattern and the gate spacer by an epitaxial growth process. However, the source/drain region may include stacking faults therein due to the difference in lattice constants between the active pattern and the gate spacer. This may make it difficult to improve the performance of the semiconductor device. Thus, the performance of the semiconductor device may be reduced or lowered.

However, in semiconductor devices according to example embodiments, the first gate spacers 130 including the semiconductor material layer similar to the first and second active patterns 110 and 120 may be used, such that stacking faults in the source/drain regions (e.g., the first epitaxial patterns 140) may be reduced or prevented from being formed. Additionally, the source/drain regions (e.g., the first epitaxial patterns 140) may be prevented from being damaged or the likelihood of damage may be reduced.

To manufacture semiconductor devices having a gate all around (GAA) structure, active layers (see, e.g., 2002 of FIG. 16) and sacrificial layers (see, e.g., 2001 of FIG. 16) having an etch selectivity with respect to one another may be used. For example, the sacrificial layers (see, e.g., 2001 of FIG. 16) including germanium (Ge) may have etch selectivity with respect to the active layers (see, e.g., 2002 of FIG. 16) including silicon (Si). When the semiconductor device is a PMOS transistor, the first epitaxial patterns 140 may also include germanium (Ge). Thus, due to a low etch selectivity in a removal process of the sacrificial layers (see, e.g., 2001 of FIG. 16), the first epitaxial patterns 140 may be damaged. Accordingly, the performance and reliability of the semiconductor device may be reduced or lowered.

However, in semiconductor devices according to example embodiments, the first gate spacers 130 including the semiconductor material layer similar to the first and second active patterns 110 and 120 (that are the channel region) may be used to reduce or prevent the damage to the source/drain regions (e.g., the first epitaxial patterns 140). For example, the first gate spacers 130 may include the semiconductor material layer similar to the first and second active patterns 110 and 120 such that the first epitaxial patterns 140 are protected from being damaged in the removal process of the sacrificial layers (see, e.g., 2001 of FIG. 16) due to the etch selectivity of the first gate spacers 130.

Figure 5:
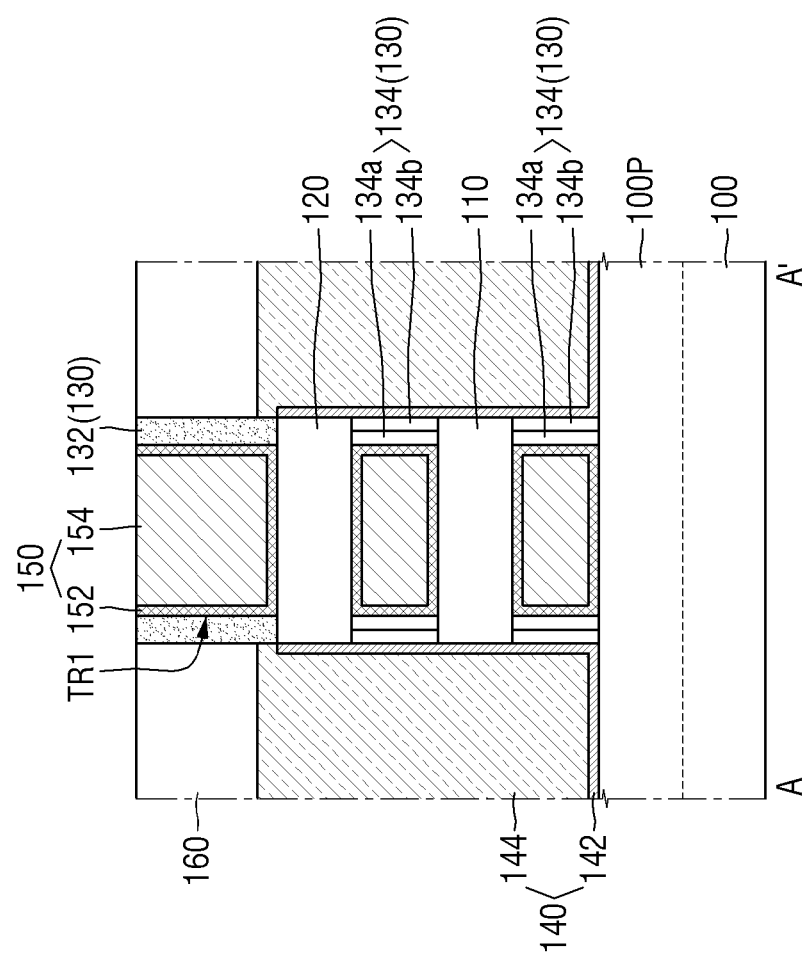
FIG. 5 is a cross-sectional view of a semiconductor device according to example embodiments.

FIG. 5 is a cross-sectional view illustrating a semiconductor device according to example embodiments. In FIG. 5, the same numerals are used to denote the same elements as shown in FIGS. 1 to 4.

Referring to FIG. 5, in a semiconductor device according to example embodiments, the first inner spacer 134 may be formed of multiple sections. For example, the first inner spacer 134 includes a first sub spacer 134a and a second sub spacer 134b.

The first sub spacer 134a may be formed along a profile of a surface of the first gate insulation layer 152. The second sub spacer 134b may be formed on a sidewall of the first sub spacer 134a.

In some embodiments, the first sub spacer 134a and the second sub spacer 134b may include a semiconductor material at different concentrations.

For example, when the first active pattern 110 and the second active pattern 120 include silicon (Si), the first sub spacer 134a and the second sub spacer 134b may include silicon (Si) or silicon germanium (SiGe). In this case, a silicon concentration in the first sub spacer 134a may be higher than that in the second sub spacer 134b. Thus, in the removal process of the sacrificial layers (see, e.g., 2001 of FIG. 16) including germanium (Ge), the first epitaxial patterns 140 may be protected from being damaged due to the etch selectivity of the first sub spacer 134a.

In some embodiments, when the first active pattern 110 and the second active pattern 120 include silicon germanium (SiGe) or germanium (Ge), the first sub spacer 134a and the second sub spacer 134b may include silicon germanium (SiGe) or germanium (Ge). In this case, a germanium concentration in the first sub spacer 134a may be higher than that in the second sub spacer 134b. Thus, in the removal process of the sacrificial layers (see, e.g., 2001 of FIG. 16) including silicon (Si), the first epitaxial patterns 140 may be protected from being damaged due to the etch selectivity of the first sub spacer 134a.

In some embodiments, the first sub spacer 134a may include an insulating material, and the second sub spacer 134b may include a semiconductor material layer similar to the first active pattern 110 and the second active pattern 120.

For example, the first sub spacer 134a may include a low-k dielectric material, silicon nitride, silicon oxynitride, silicon oxide, silicon oxycarbonitride, or combinations thereof. The low-k dielectric material of the first sub spacer 134a may be a material having a dielectric constant smaller than that of silicon oxide. The first sub spacer 134a may serve to reduce a parasitic capacitance between the first gate electrode 154 and the first epitaxial patterns 140.

For example, when the first active pattern 110 and the second active pattern 120 include silicon (Si), the second sub spacer 134b may include silicon (Si) or silicon germanium (SiGe). For example, when the first active pattern 110 and the second active pattern 120 include silicon germanium (SiGe) or germanium (Ge), the second sub spacer 134b may include silicon germanium (SiGe) or germanium (Ge). The second sub spacer 134b may serve to reduce or prevent stacking faults in the first epitaxial patterns 140 from being formed.

Figure 6:
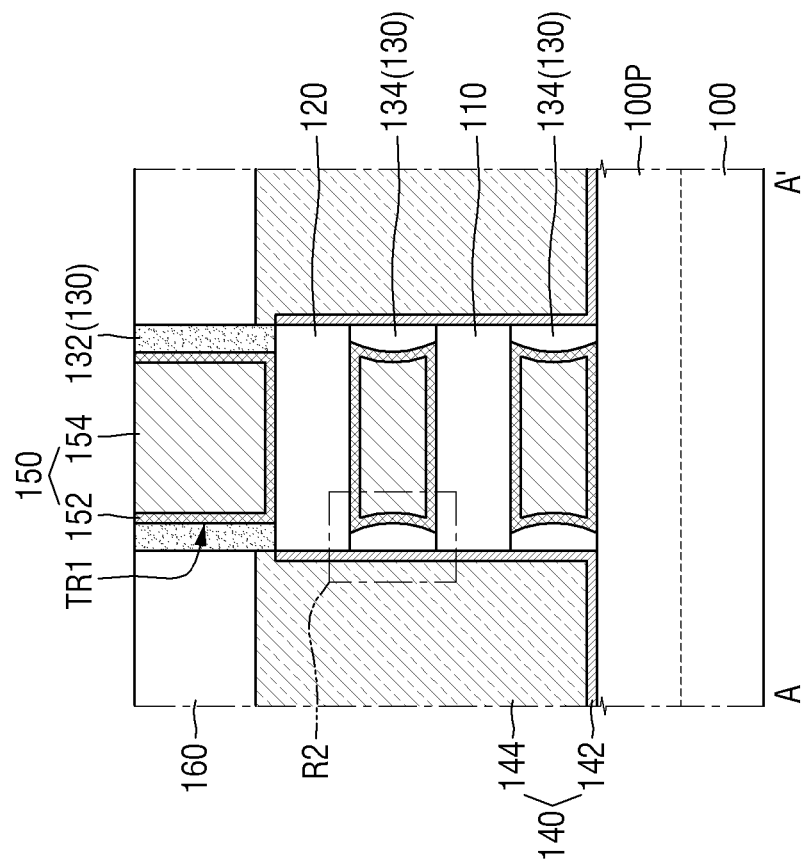
FIG. 6 is a cross-sectional view of a semiconductor device according to example embodiments.
Figure 7:
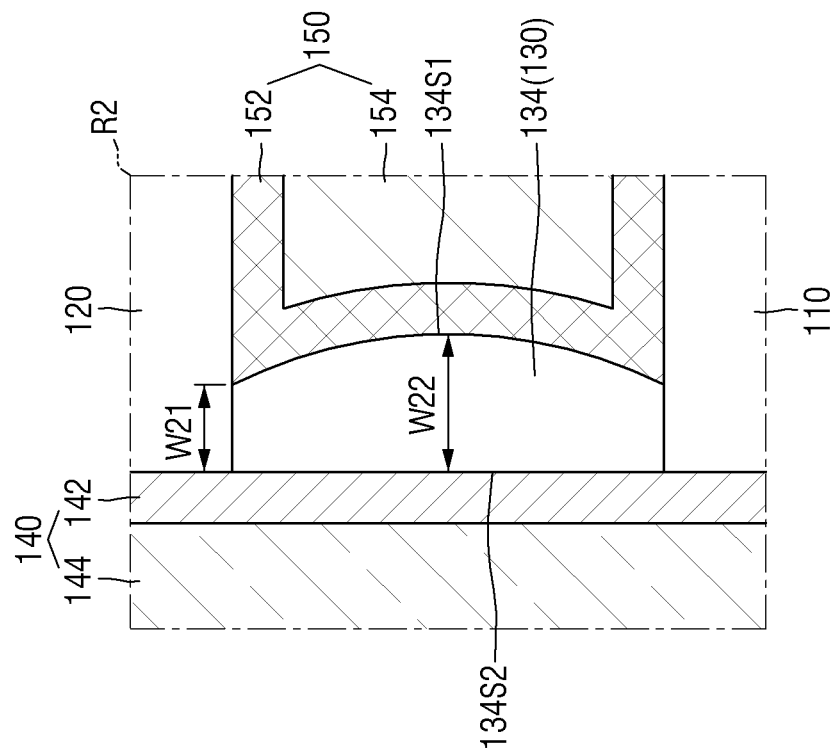
FIG. 7 is an enlarged view of portion R2 of FIG. 6.

FIG. 6 is a cross-sectional view of a semiconductor device according to example embodiments. FIG. 7 is an enlarged view of portion R2 of FIG. 6. In FIGS. 6 and 7, the same numerals are used to denote the same elements as shown in FIGS. 1 to 4.

Referring to FIGS. 6 and 7, in a semiconductor device according to example embodiments, at least one sidewall of the first inner spacer 134 may have a curved surface. For example, a first sidewall 134S1 of the first inner spacer 134 adjacent to the first gate electrode 154 may have a convex curved shape toward the first gate electrode 154.

The first gate insulation layer 152 may extend along a profile of the first sidewall 134S1 of the first inner spacer 134. Thus, a surface of a portion of the first gate insulation layer 152 adjacent to the first inner spacer 134 may be concavely curved toward the first inner spacer 134. Likewise, a sidewall of the first gate electrode 154 adjacent to the first inner spacer 134 may be concavely curved. That is, the first sidewall 134S1 of the first inner spacer 134 may conformally extend along the sidewall of the gate electrode structure 152, 154.

A second sidewall 134S2 of the first inner spacer 134 adjacent to each of the first epitaxial patterns 140 may be flat or planar, but is not limited thereto. In some embodiments, the second sidewall 134S2 of the first inner spacer 134 may have a profile similar to the first sidewall 134S1 thereof. For example, the second sidewall 134S2 of the first inner spacer 134 may have a concave curved shape.

In some embodiments, a width of the first inner spacer 134 in the first direction X1 may be varied. For example, a third width W21 of a portion of the first inner spacer 134 adjacent to the first active pattern 110 or the second active pattern 120 may be smaller than a fourth width W22 of a middle portion of the first inner spacer 134.

In some embodiments, the sidewall of the first inner spacer 134 adjacent to the first active pattern 110 or the second active pattern 120 may be at an obtuse angle with respect to the first active pattern 110 or the second active pattern 120. For example, the first sidewall 134S1 of the first inner spacer 134 may be at an obtuse angle with respect to a lower surface of the second active pattern 120.

The shape of the first inner spacer 134 may be formed by a process of fabricating semiconductor devices to be described later with reference to FIGS. 24 to 26.

Figure 8:
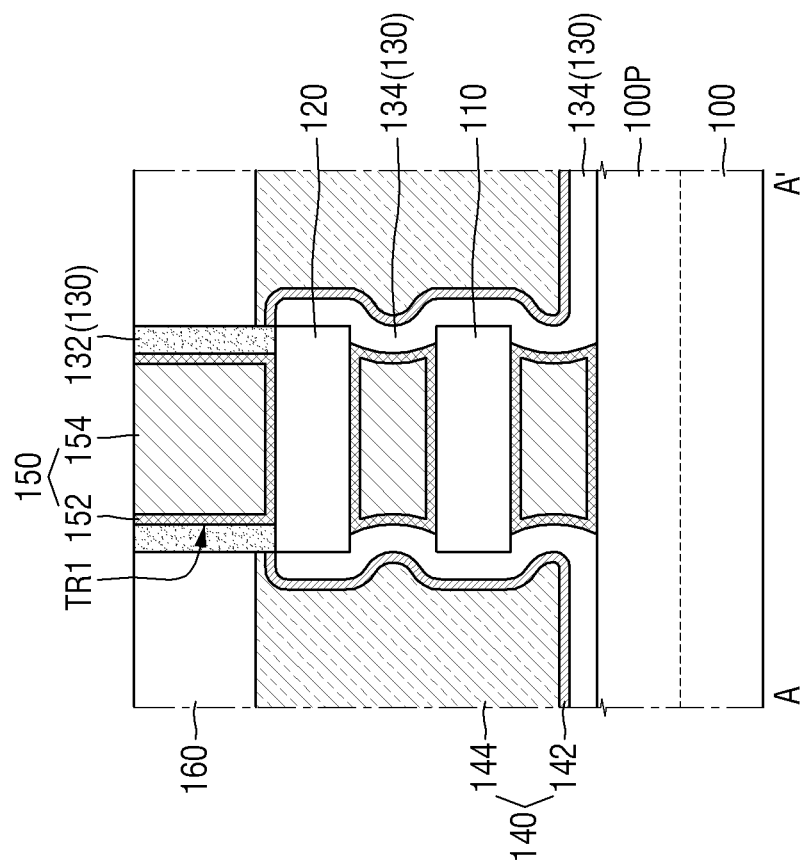
FIG. 8 is a cross-sectional view of a semiconductor device according to example embodiments.

FIG. 8 is a cross-sectional view illustrating a semiconductor device according to example embodiments. In FIG. 8, the same numerals are used to denote the same elements as shown in FIGS. 1 to 4, 6, and 7.

Referring to FIG. 8, in a semiconductor device, the first inner spacer 134 may extend (e.g., continuously) along the upper surface of the first fin protrusion 100P, the sidewall of the first active pattern 110, and the sidewall of the second active pattern 120.

For example, the first inner spacer 134 may extend along a profile of the first fin protrusion 100P, a profile of the first gate insulation layer 152, a profile of the first active pattern 110, and a profile of the second active pattern 120. Thus, the first inner spacer 134 may be interposed between the first active pattern 110 and each of the first epitaxial patterns 140 and between the second active pattern 120 and each of the first epitaxial patterns 140.

In some embodiments, the first epitaxial layer 142 of each of the first epitaxial patterns 140 may extend along a profile of the first inner spacer 134. In other embodiments, the first epitaxial layer 142 may be omitted.

In some embodiments, the first inner spacer 134 may include an impurity. For example, when the semiconductor device is a PMOS transistor, the first inner spacer 134 may include a p-type impurity. In this case, a junction region of the PMOS transistor may be adjusted depending on a concentration of the p-type impurity in the first inner spacer 134.

Figure 9:
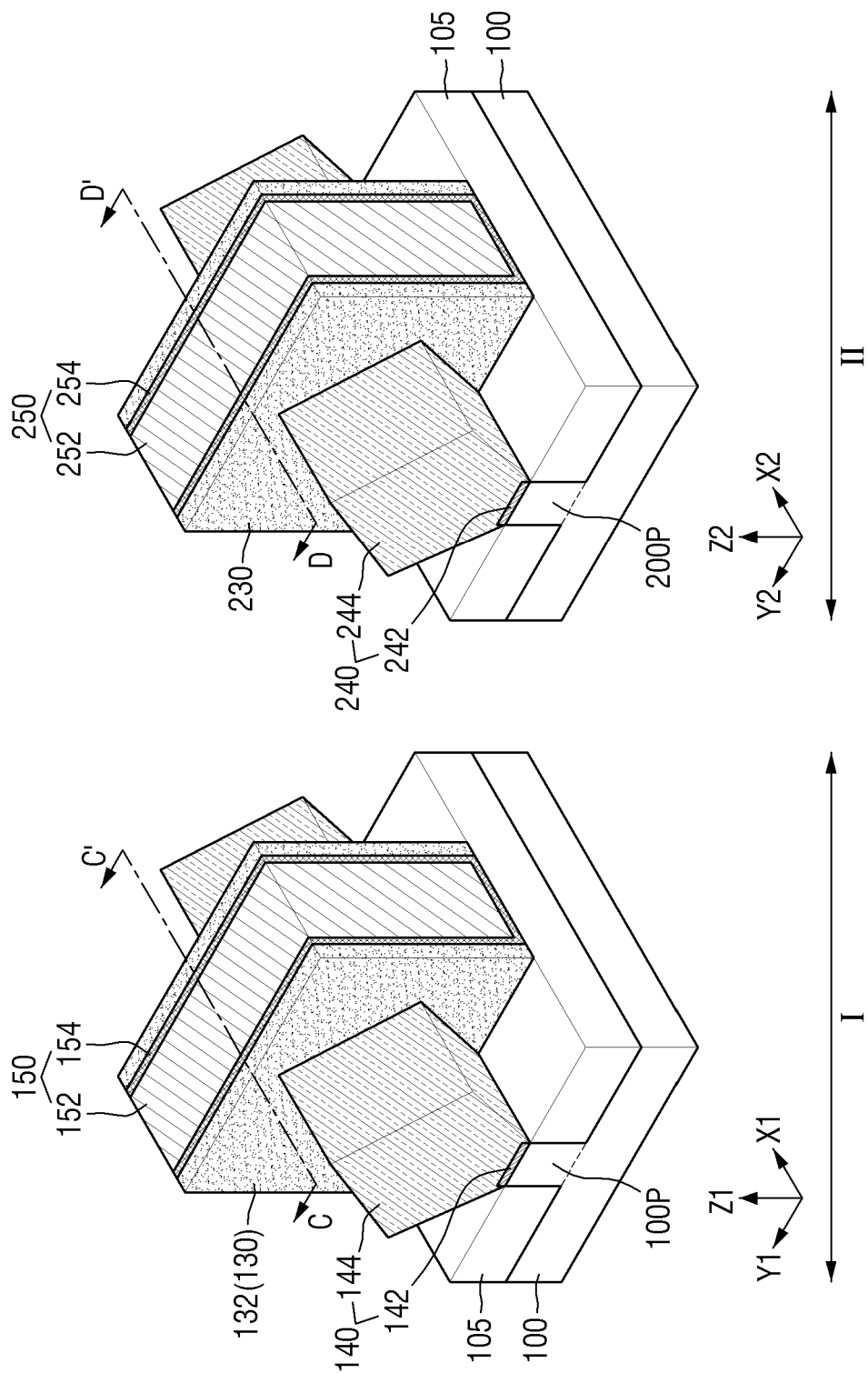
FIG. 9 is a perspective view of a semiconductor device according to example embodiments.
Figure 10:
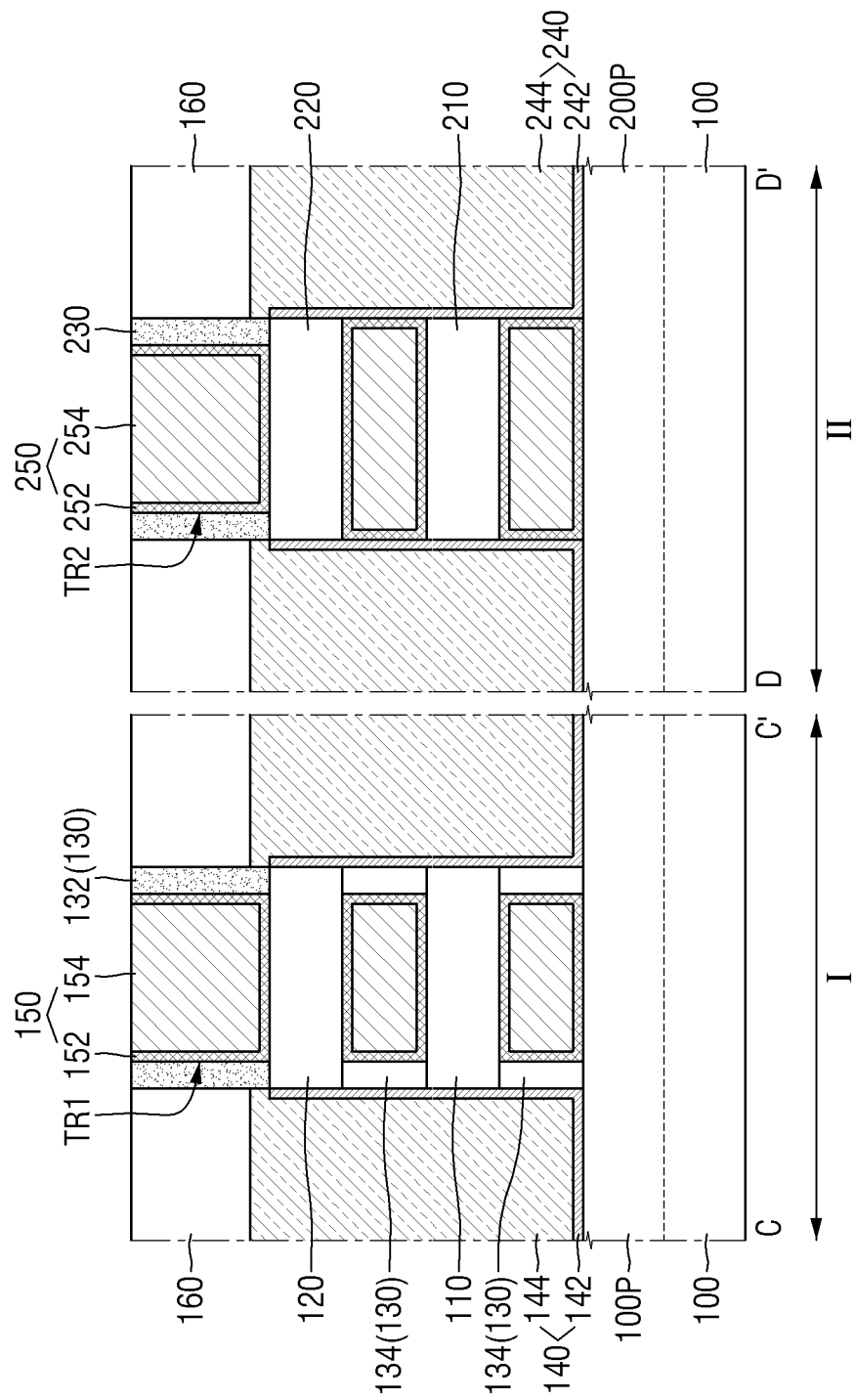
FIG. 10 is a cross-sectional view taken along lines C-C' and D-D' of FIG. 9.

FIG. 9 is a perspective view of a semiconductor device according to example embodiments. FIG. 10 is a cross-sectional view taken along lines C-C' and D-D' of FIG. 9. In FIGS. 9 and 10, the same numerals are used to denote the same elements as shown in FIGS. 1 to 4.

Referring to FIGS. 9 and 10, in a semiconductor device according to example embodiments, the substrate 100 includes a first region I and a second region II. The first region I and the second region II may be spaced apart from or be connected to each other. Transistors of the same conductive type or transistors of different conductive types may be formed on the first region I and the second region II.

The first region I and the second region II may each be, e.g., a logic region, an SRAM region, or an input/output (IO) region. For example, the first region I and the second region II may be regions on which semiconductor devices for performing the same function or different functions are disposed.

In some embodiments, the semiconductor device on the first region I is the same as that described with reference to FIGS. 1 to 4, and thus a detailed description thereof is omitted.

The semiconductor device on the second region II includes a second fin protrusion 200P, a third active pattern 210, a fourth active pattern 220, a second gate structure 250, second gate spacers 230, and second epitaxial patterns 240.

The second fin protrusion 200P may protrude from the upper surface of the substrate 100 and extend lengthwise in a fourth direction X2. The second fin protrusion 200P may be formed by etching a portion of the substrate 100 or may be an epitaxial layer grown from the substrate 100.

The third active pattern 210 may be formed on the substrate 100. The third active pattern 210 may be spaced apart from the substrate 100. The third active pattern 210 may extend in the fourth direction X2.

The fourth active pattern 220 may be formed on the third active pattern 210 and be spaced apart from the third active pattern 210. The fourth active pattern 220 may extend in the fourth direction X2.

The third active pattern 210 and the fourth active pattern 220 may include the same material as or a different material from the first active pattern 110 and the second active pattern 120.

The second gate structure 250 includes a second gate insulation layer 252 and a second gate electrode 254.

The second gate electrode 254 may be formed on the substrate 100. The second gate electrode 254 may intersect the third active pattern 210 and the fourth active pattern 220. The second gate electrode 254 may extend lengthwise in a fifth direction Y2.

The second gate electrode 254 may surround the third active pattern 210 and the fourth active pattern 220. The third active pattern 210 and the fourth active pattern 220 may penetrate or extend through the second gate electrode 254.

The second gate spacers 230 may be disposed on sidewalls of the second gate electrode 254. The second gate spacers 230 may define a second trench TR2 crossing the third active pattern 210 and the fourth active pattern 220.

The second gate spacers 230 may be disposed on opposite end portions of the third active pattern 210 and/or the fourth active pattern 220. In some embodiments, the third active pattern 210 and the fourth active pattern 220 may penetrate or extend through the second gate spacers 230. In some embodiments, the second gate spacers 230 may not include an inner spacer.

The second gate insulation layer 252 may be interposed between the third active pattern 210 and the second gate electrode 254 and between the fourth active pattern 220 and the second gate electrode 254. The second gate insulation layer 252 may surround the third active pattern 210 and the fourth active pattern 220. The second gate insulation layer 252 may be formed on the upper surface of the field insulation layer 105 and an upper surface of the second fin protrusion 200P.

The second gate insulation layer 252 may extend along inner sidewalls of the second gate spacers 230. For example, the second gate insulation layer 252 may extend along sidewalls and a lower surface of the second trench TR2.

The second epitaxial patterns 240 may be formed on opposite sides of the second gate electrode 254. The second epitaxial patterns 240 may contact the third active pattern 210, the fourth active pattern 220, and the second gate insulation layer 252. For example, the second epitaxial patterns 240 may be formed on sidewalls of the third active pattern 210, sidewalls of the fourth active pattern 220, and an outer surface of the second gate insulation layer 252.

In some embodiments, each of the second epitaxial patterns 240 may include multiple layers. For example, each of the second epitaxial patterns 240 may include a third epitaxial layer 242 and a fourth epitaxial layer 244 that are sequentially formed on the substrate 100.

In some embodiments, the transistors on the first region I and the second region II may be PMOS transistors. For example, each of the first epitaxial patterns 140 and the second epitaxial patterns 240 may include a p-type impurity.

In some embodiments, the first epitaxial patterns 140 and the second epitaxial patterns 240 may include a semiconductor material at different concentrations. For example, the first epitaxial patterns 140 and the second epitaxial patterns 240 may include silicon germanium (SiGe). In some embodiment, a germanium concentration in each of the first epitaxial patterns 140 may be higher than that in each of the second epitaxial patterns 240. In some embodiments, the germanium concentration in the first epitaxial layer 142 may be higher than that in the third epitaxial layer 242.

Figure 16:
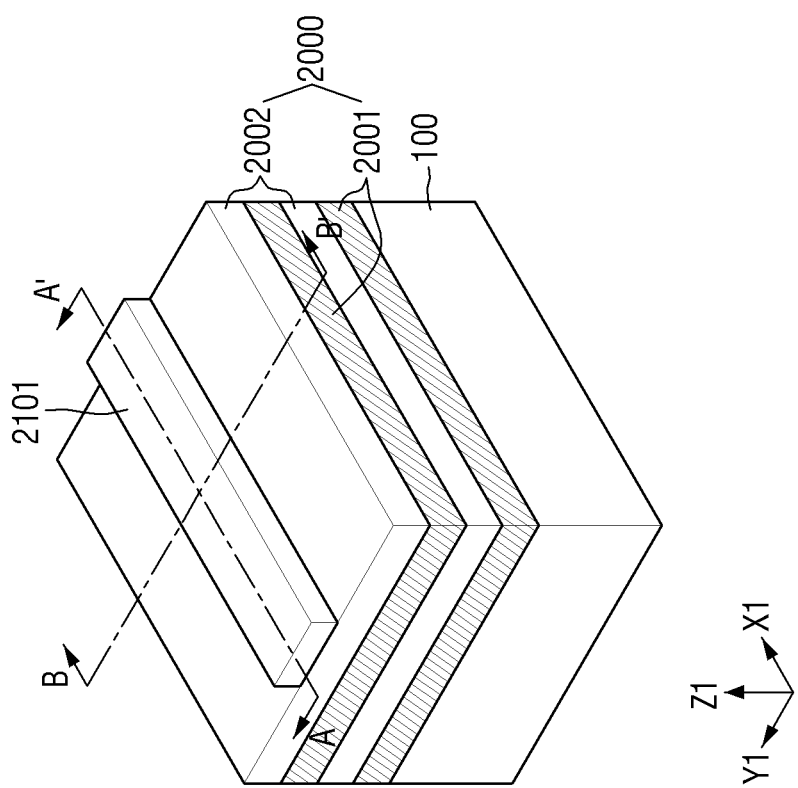
FIGS. 16 to 29 are views illustrating stages in a method of manufacturing an image sensor according to example embodiments.

When the semiconductor device is a PMOS transistor, the source/drain region including germanium at a high concentration may be damaged during the removal process of the sacrificial layers (see, e.g., 2001 of FIG. 16). In semiconductor devices according to example embodiments, the first epitaxial patterns 140 may be prevented from being damaged by using the first gate spacers 130 including the semiconductor material layer similar to the channel region (e.g., the first and second active patterns 110 and 120).

Figure 11:
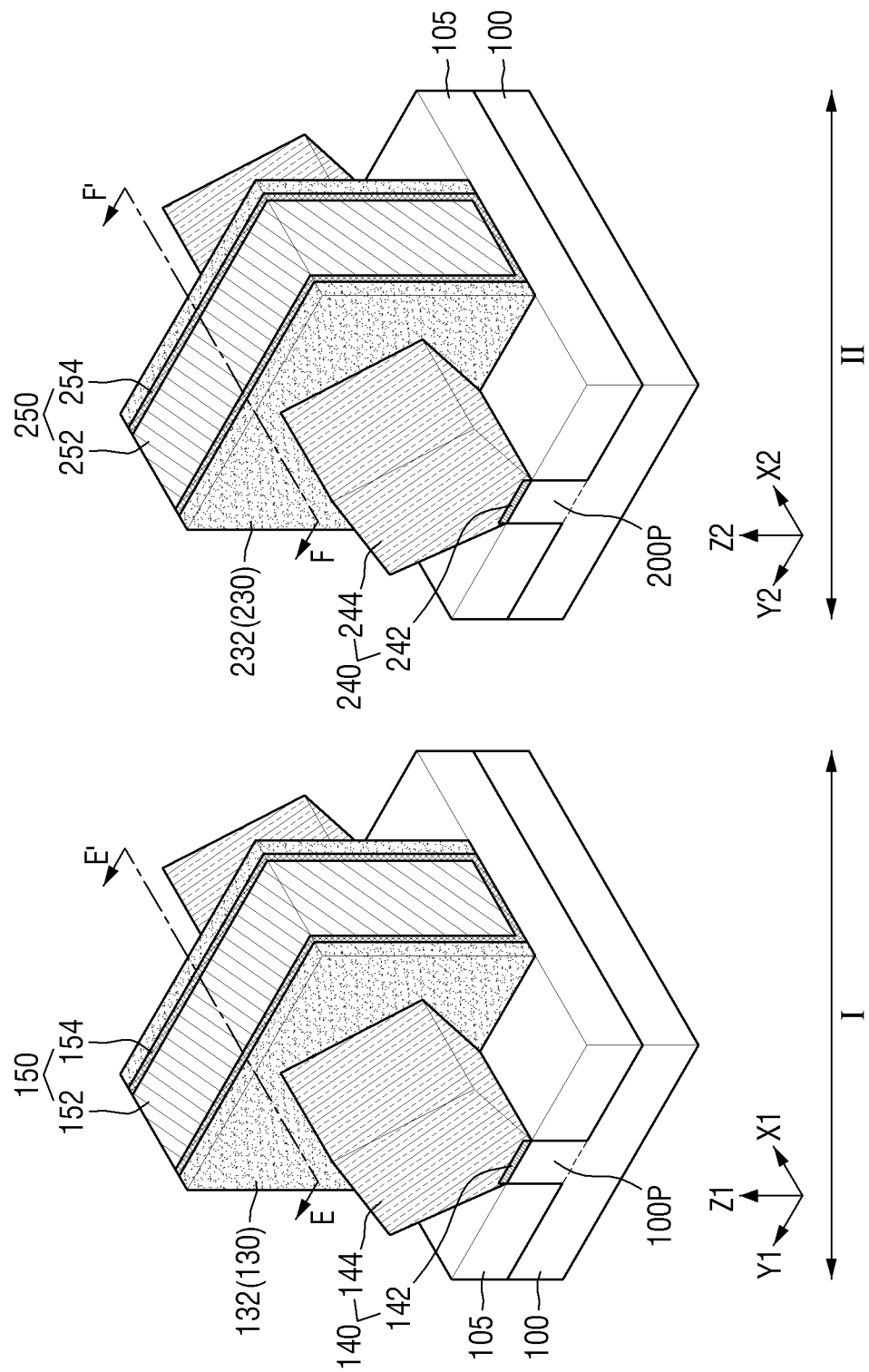
FIG. 11 is a perspective view of a semiconductor device according to example embodiments.
Figure 12:
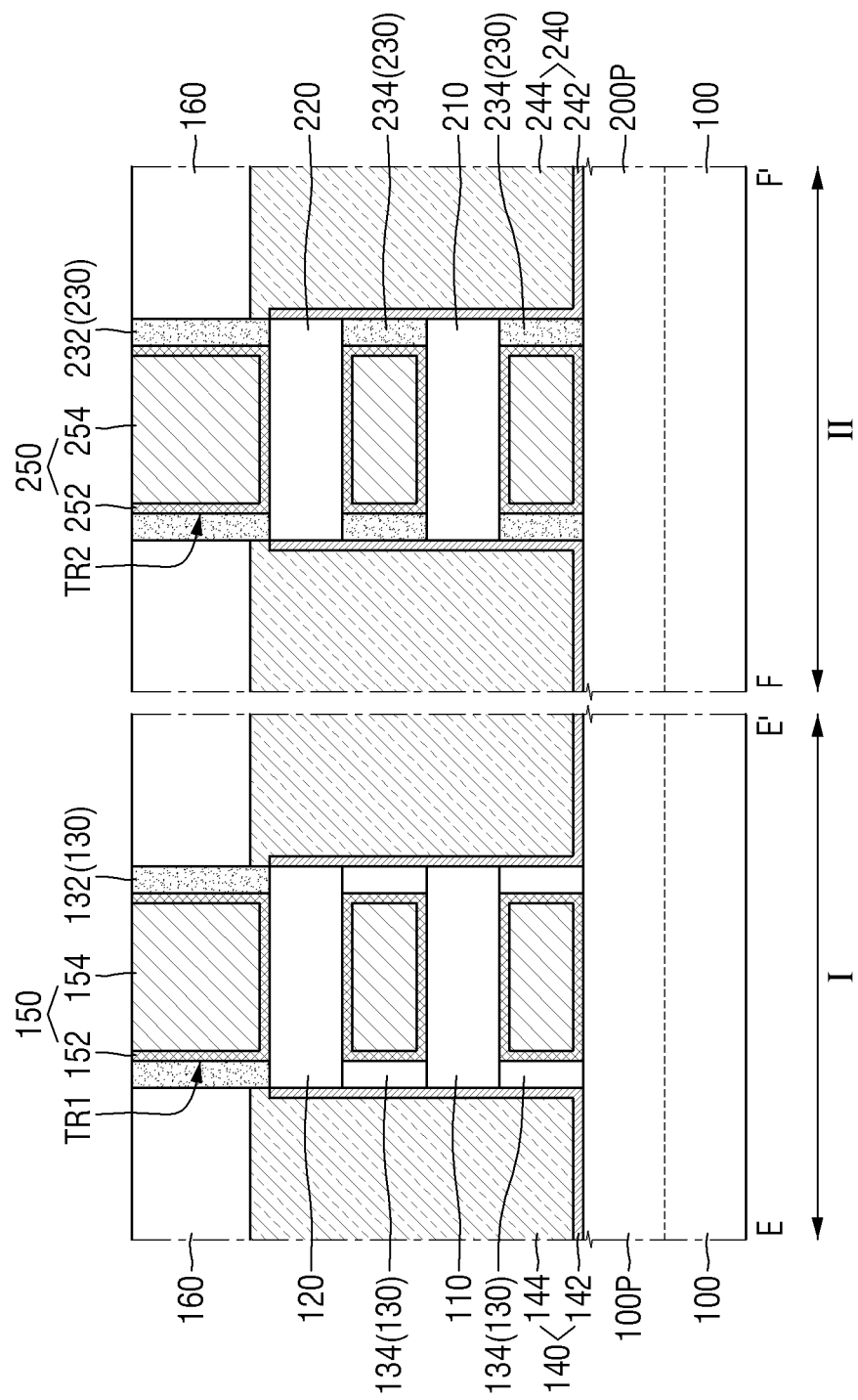
FIG. 12 is a cross-sectional view taken along lines E-E' and F-F' of FIG. 11.

FIG. 11 is a perspective view of a semiconductor device according to example embodiments. FIG. 12 is a cross-sectional view taken along lines E-E' and F-F' of FIG. 11. In FIGS. 11 and 12, the same numerals are used to denote the same elements as shown in FIGS. 1 to 4, 9, and 10.

Referring to FIGS. 11 and 12, in a semiconductor device according to example embodiments, each of the second gate spacers 230 may include a second outer spacer 232 and a second inner spacer 234.

The second inner spacer 234 may be formed on a sidewall of the second gate electrode 254 surrounding the third active pattern 210 and the fourth active pattern 220. The second outer spacer 232 may be formed on the second inner spacer 234. The second outer spacer 232 may be formed on the fourth active pattern 220.

The second inner spacer 234 may be formed between the second fin protrusion 200P and the third active pattern 210 and between the third active pattern 210 and the fourth active pattern 220.

In some embodiments, the transistors on the first region I and the second region II may be NMOS transistors. For example, each of the first epitaxial patterns 140 and the second epitaxial patterns 240 may include an n-type impurity.

In some embodiments, the first inner spacer 134 may include a semiconductor material layer similar to the first active pattern 110 and the second active pattern 120. The second inner spacer 234 may include an insulating material layer.

For example, when the first active pattern 110 and the second active pattern 120 include silicon (Si), the first inner spacer 134 may include silicon (Si) or silicon germanium (SiGe). For example, when the first active pattern 110 and the second active pattern 120 include silicon germanium (SiGe), germanium (Ge), the first inner spacer 134 may include silicon germanium (SiGe), germanium (Ge).

The second inner spacer 234 may include, e.g., a low-k dielectric material, silicon nitride, silicon oxynitride, silicon oxide, silicon oxycarbonitride, or combinations thereof. The low-k dielectric material may have a lower dielectric constant than that of silicon oxide.

In semiconductor devices according to example embodiments, for example, stacking faults in the source/drain region of the transistor that is on, e.g., the first region I may be reduced or prevented, and the parasitic capacitance between the gate electrode and the source/drain region of the transistor that is on, e.g., the second region II may be reduced or prevented.

Figure 13:
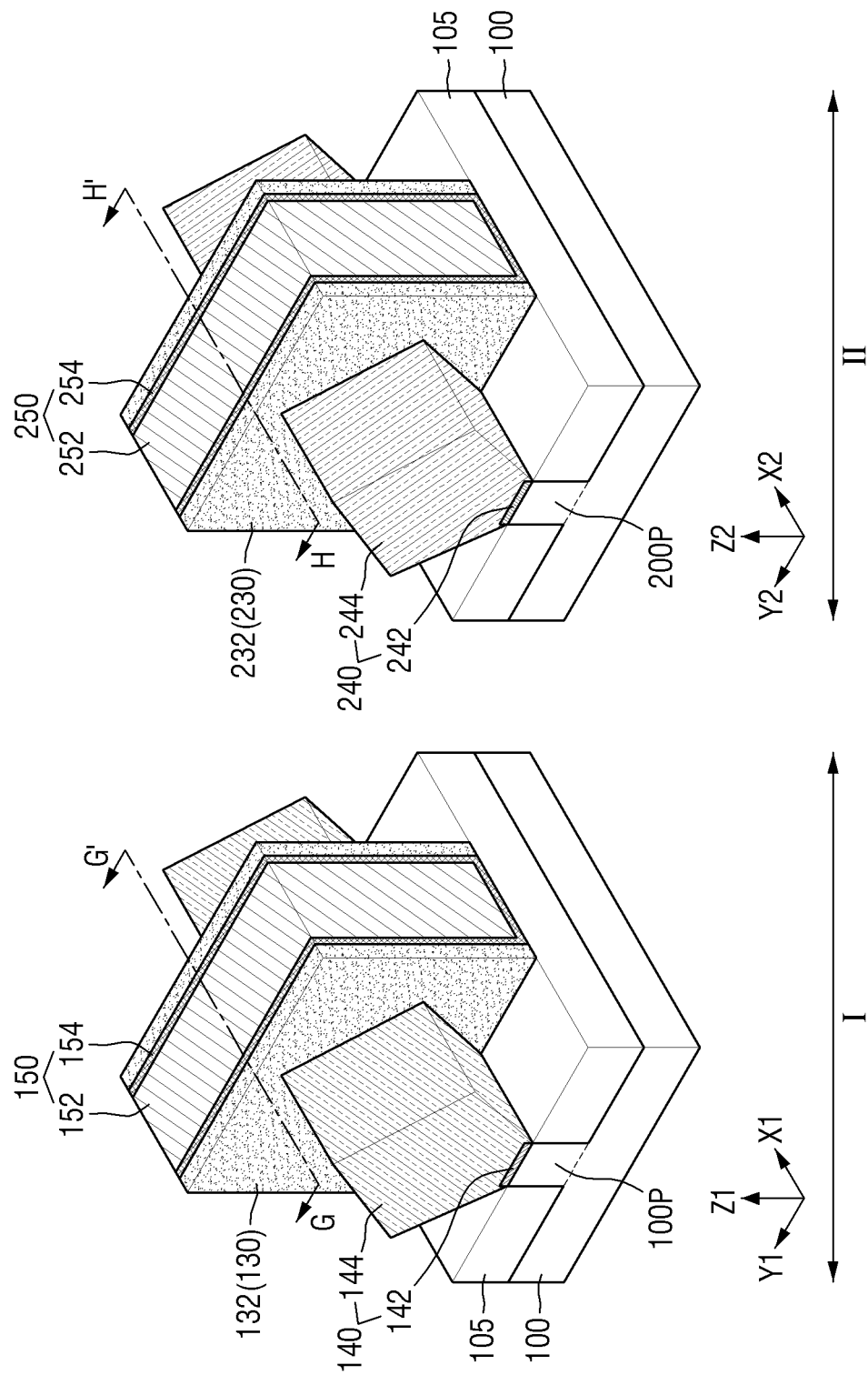
FIG. 13 is a perspective view of a semiconductor device according to example embodiments.
Figure 14:
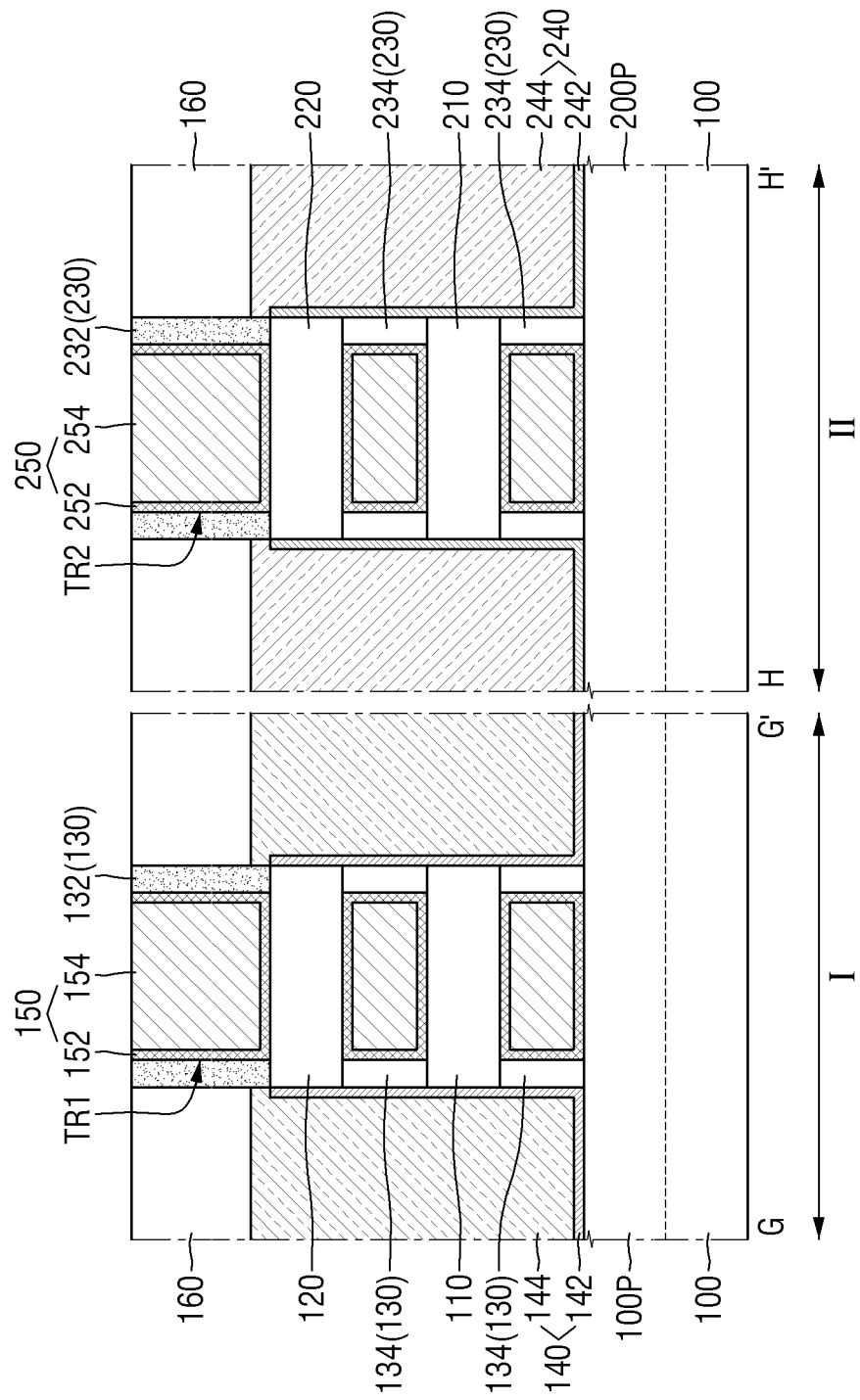
FIGS. 14 and 15 are cross-sectional views taken along lines G-G' and H-H' of FIG. 13.
Figure 15:
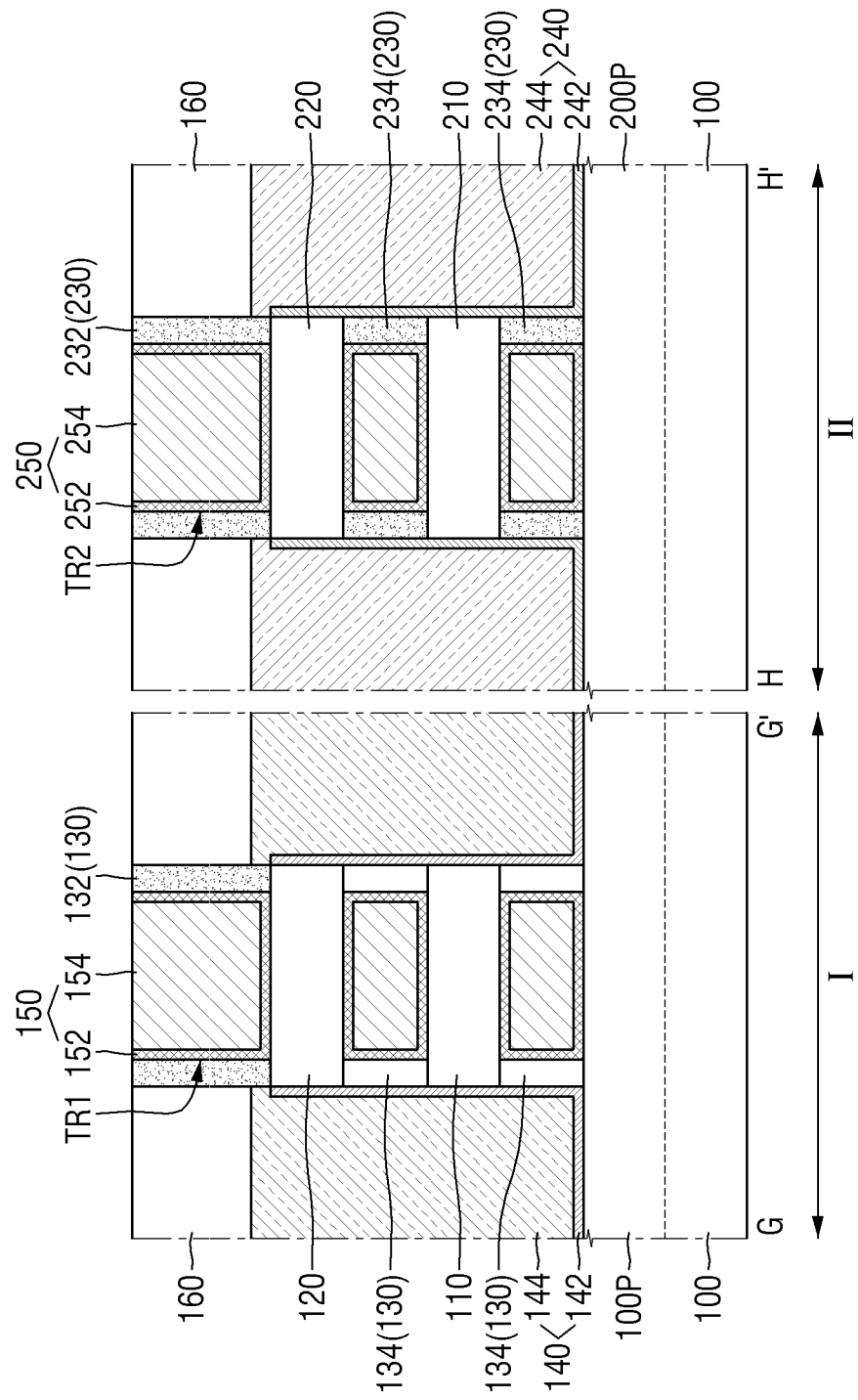

FIG. 13 is a perspective view of a semiconductor device according to example embodiments. FIGS. 14 and 15 are cross-sectional views taken along lines G-G' and H-H' of FIG. 13. In FIGS. 13 to 15, the same numerals are used to denote the same elements as shown in FIGS. 1 to 4, and 9 to 12.

Referring to FIGS. 13 and 14, in a semiconductor device according to example embodiments, a transistor on the first region I is a PMOS transistor, and a transistor on the second region II is an NMOS transistor. For example, the first epitaxial patterns 140 may include a p-type impurity. The second epitaxial patterns 240 may include an n-type impurity.

In some embodiments, the first inner spacer 134 may include a first semiconductor material layer similar to the first active pattern 110 and the second active pattern 120, and the second inner spacer 234 may include a second semiconductor material layer similar to the third active pattern 210 and the fourth active pattern 220.

For example, when the first active pattern 110 and the second active pattern 120 include silicon (Si), the first inner spacer 134 may include silicon (Si) or silicon germanium (SiGe). For example, when the first active pattern 110 and the second active pattern 120 include silicon germanium (SiGe) or germanium (Ge), the first inner spacer 134 may include silicon germanium (SiGe) or germanium (Ge).

For example, when the third active pattern 210 and the fourth active pattern 220 include silicon (Si), the second inner spacer 234 may include silicon (Si) or silicon germanium (SiGe). For example, when the third active pattern 210 and the fourth active pattern 220 include silicon germanium (SiGe) or germanium (Ge), the second inner spacer 234 may include silicon germanium (SiGe) or germanium (Ge), Referring to FIGS. 13 and 15, in a semiconductor device according to example embodiments, a transistor on the first region I is a PMOS transistor, and a transistor on the second transistor II is an NMOS transistor. For example, the first epitaxial patterns 140 may include a p-type impurity. The second epitaxial patterns 240 may include an n-type impurity.

In some embodiments, the first inner spacer 134 may include a first semiconductor material layer similar to the first active pattern 110 and the second active pattern 120, and the second inner spacer 234 may include an insulating material layer.

For example, when the first active pattern 110 and the second active pattern 120 include silicon (Si), the first inner spacer 134 may include silicon (Si) or silicon germanium (SiGe). For example, when the first active pattern 110 and the second active pattern 120 include silicon germanium (SiGe) or germanium (Ge), the first inner spacer 134 may include silicon germanium (SiGe) or germanium (Ge).

For example, the second inner spacer 234 may include, e.g., a low-k dielectric material, silicon nitride, silicon oxynitride, silicon oxide, silicon oxycarbonitride, or combinations thereof. The low-k dielectric material may have a lower dielectric constant than that of silicon oxide.

FIGS. 16 to 29 are views illustrating example stages or operations in a method of manufacturing an image sensor according to example embodiments. FIGS. 17, 19, 21, and 23 to 28 are cross-sectional views taken along line A-A' of FIG. 16. FIGS. 18, 20, 22, and 29 are cross-sectional views taken along line B-B' of FIG. 16. In FIGS. 16 to 29, the same numerals are used to denote the same elements as shown in FIGS. 1 to 15.

Figure 17:
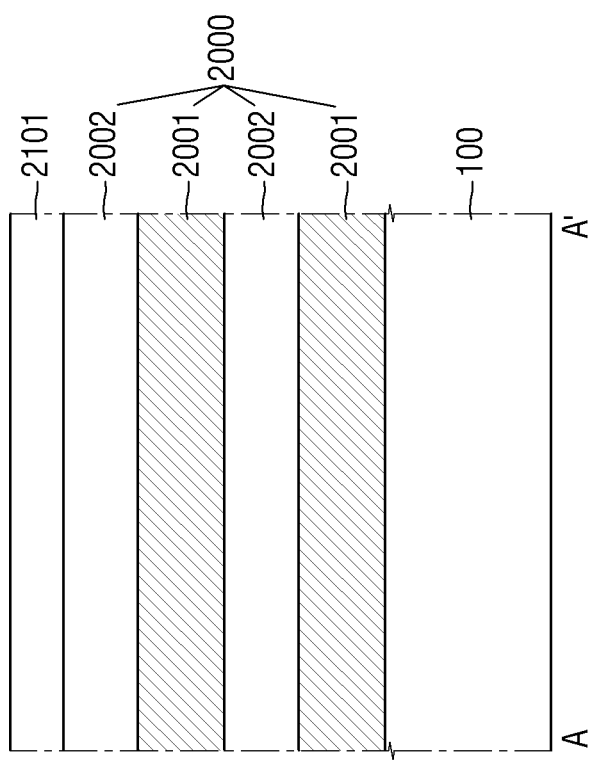
Figure 18:
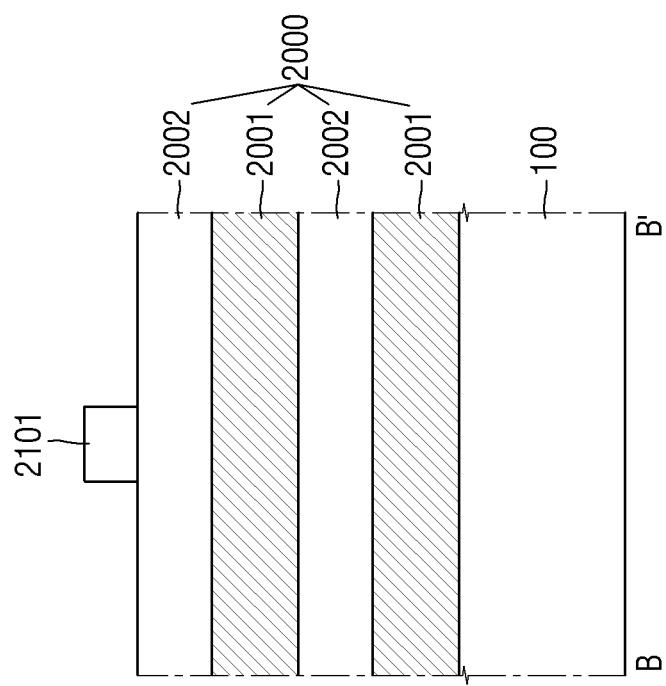

Referring to FIGS. 16 to 18, a semiconductor stack layer 2000 including the sacrificial layers 2001 and the active layers 2002 that are alternately stacked is formed on the substrate 100. The active layers 2002 may include a material having an etch selectivity with respect to the sacrificial layers 2001. The sacrificial layers 2001 and the active layers 2002 may be formed by an epitaxial growth process.

Referring to FIGS. 16 and 18, two sacrificial layers 2001 and two active layers 2002 are formed on the substrate 100. However, the number of the sacrificial layers 2001 and the number of the active layers 2002 are not limited thereto. In addition, the stacked order of the sacrificial layers 2001 and the active layers 2002 may be varied. For example, in the semiconductor stack layer 2000, one of the active layers 2002 may be disposed at an uppermost level, as shown in the drawings. In some embodiments, one of the sacrificial layers 2001 may be disposed at the uppermost level in the semiconductor stack layer 2000.

A first mask pattern 2101 may be formed on the semiconductor stack layer 2000. The first mask pattern 2101 may extend lengthwise in the first direction X1.

Figure 19:
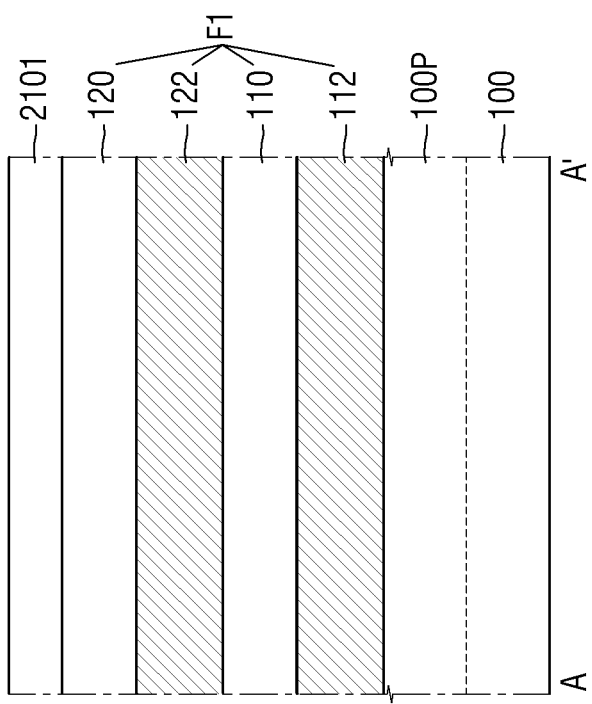
Figure 20:
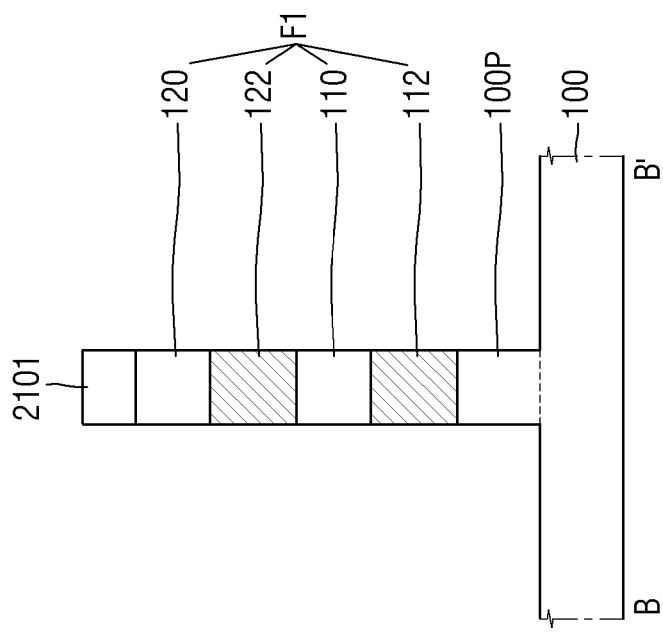

Referring to FIGS. 19 and 20, the semiconductor stack layer 2000 and the substrate 100 are etched using the first mask pattern 2101 as an etch mask. Thus, a fin structure F1 may be formed on the substrate 100.

The sacrificial layers 2001 may be etched to form a first sacrificial pattern 112 and a second sacrificial pattern 122 that extend lengthwise in the first direction X1. The active layers 2002 may be etched to form the first active pattern 110 and a second active pattern 120 that extend lengthwise in the first direction X1.

The fin structure F1 includes the first fin protrusion 100P, the first sacrificial pattern 112, the first active pattern 110, the second sacrificial pattern 122, and the second active pattern 120 that are sequentially stacked.

Figure 21:
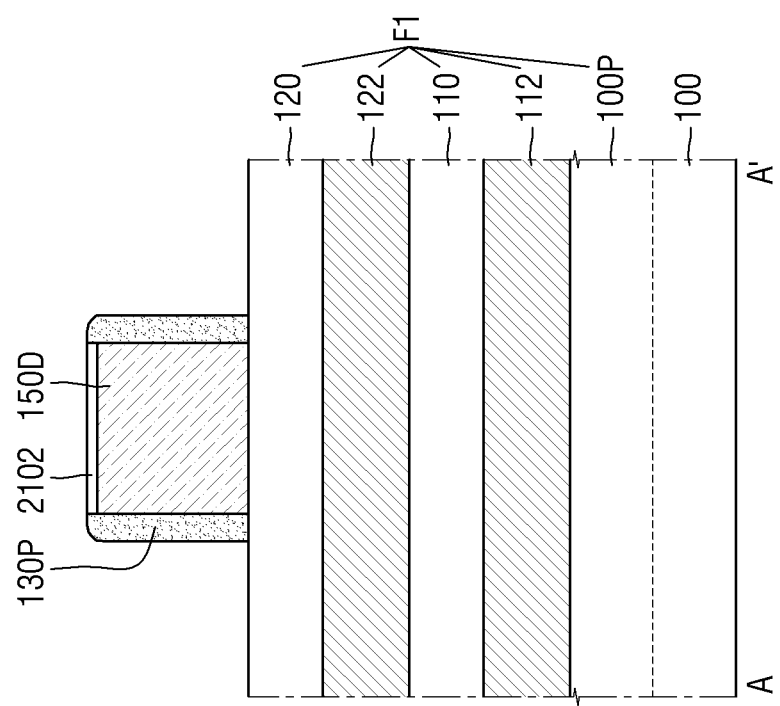
Figure 22:
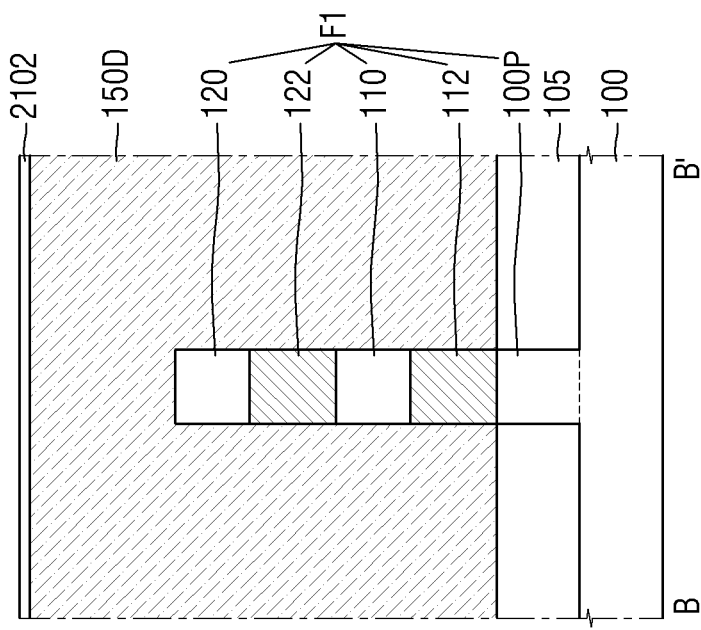

Referring to FIGS. 21 and 22, the field insulation layer 105 is formed on the substrate 100 and cover at least a portion of a sidewall of the fin structure F1. During the process of forming the field insulation layer 105, the first mask pattern 2101 may be removed.

A dummy gate electrode 150D is formed on the fin structure F1. The dummy gate electrode 150D may intersect the fin structure F1 and extend lengthwise in the second direction Y1. The dummy gate electrode 150D may be formed using a second mask pattern 2102 as an etch mask. Even though not shown in the drawing, a dummy gate insulation layer or a fin structure protection layer may be further formed between the dummy gate electrode 150D and the fin structure F1.

Preliminary gate spacers 130P are formed on sidewalls of the dummy gate electrode 150D.

Figure 23:
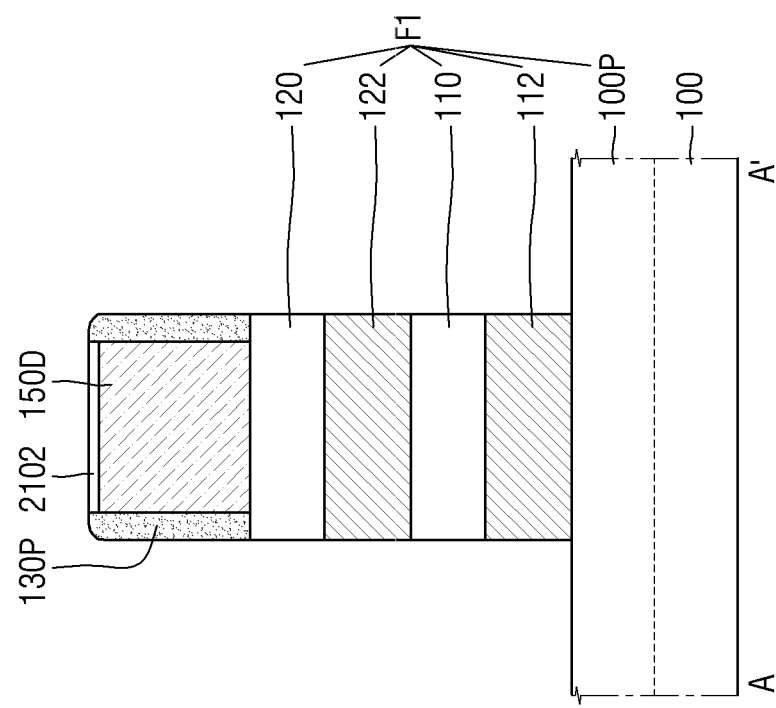

Referring to FIG. 23, the fin structure F1 is etched using the dummy gate electrode 150D and the preliminary gate spacers 130P as an etch mask.

Thus, a portion of the first sacrificial pattern 112, a portion of the first active pattern 110, a portion of the second sacrificial pattern 122, and a portion of the second active pattern 120 may be removed. In some embodiments, an undercut region may be formed in the fin structure F1. For example, the undercut region may be formed under the dummy gate electrode 150D and the preliminary gate spacers 130P.

In some embodiments, when the fin structure F1 is etched, the upper surface of the first fin protrusion 100P may be exposed. In some embodiments, when the fin structure F1 is etched, a portion of the first fin protrusion 100P may be etched.

Figure 24:
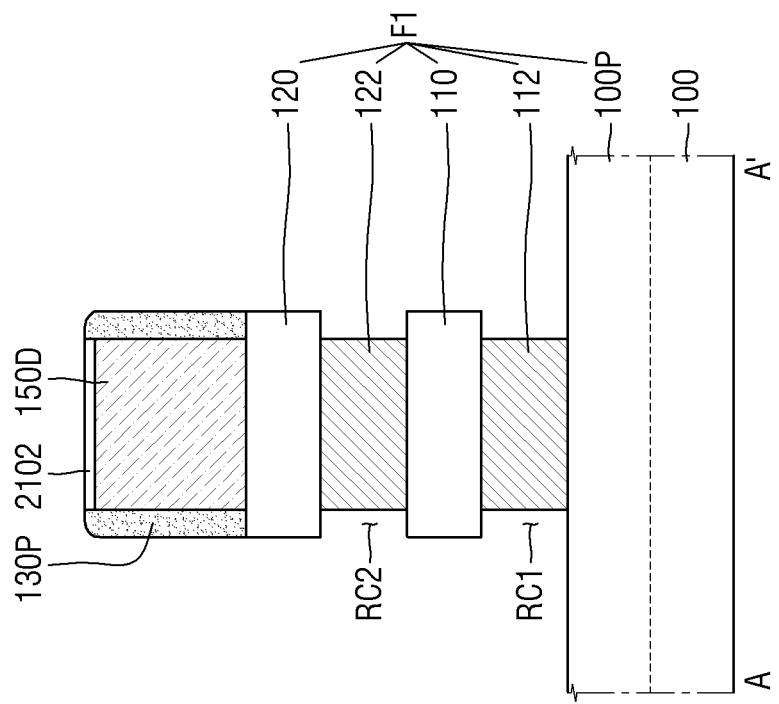

Referring to FIG. 24, sidewalls of the first sacrificial pattern 112 and sidewalls of the second sacrificial pattern 122 are selectively recessed.

For example, when the fin structure F1 is etched, the sidewalls of the first sacrificial pattern 112 and sidewalls of the first active pattern 110, the sidewalls of the second sacrificial pattern 122, and sidewalls of the second active pattern 120 may be exposed. At this time, the exposed sidewalls of the first sacrificial pattern 112 and the exposed sidewalls of the second sacrificial pattern 122 are selectively recessed.

Since the first active pattern 110 and the second active pattern 120 include the material having the etch selectivity with respect to the first sacrificial pattern 112 and the second sacrificial pattern 122, the first sacrificial pattern 112 and the second sacrificial pattern 122 may be selectively etched.

Thus, a first recess RC1 is formed on the sidewalls of the first sacrificial pattern 112, between the first fin protrusion 100P and the first active pattern 110. Additionally, a second recess RC2 is formed on the sidewalls of the second sacrificial pattern 122, between the first active pattern 110 and the second active pattern 120. The sidewalls of the first sacrificial pattern 112 and the sidewalls of the second sacrificial pattern 122 on which the first recess RC1 and the second recess RC2 are formed may be flat or planar as shown in the drawing, but are not limited thereto. For example, the sidewalls of the first sacrificial pattern 112 and the sidewalls of the second sacrificial pattern 122 may have a concave or other curved shape depending on the recess process.

Figure 25:
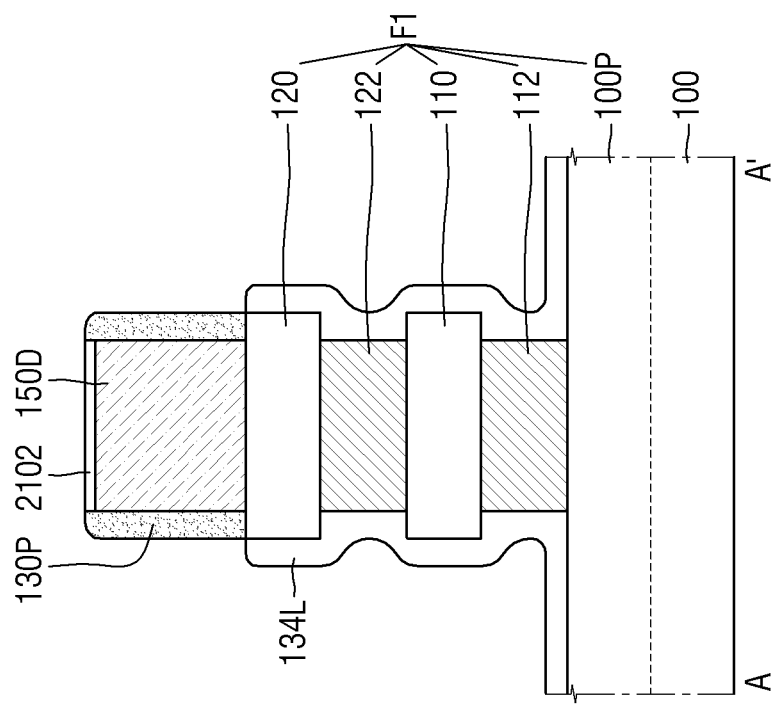

Referring to FIG. 25, an inner spacer layer 134L including a material similar to the first active pattern 110 and the second active pattern 120 is formed on the substrate 100. For example, the inner spacer layer 134L including a semiconductor material may be formed on the substrate 100.

For example, when the first active pattern 110 and the second active pattern 120 include silicon (Si), the inner spacer layer 134L may include silicon (Si) or silicon germanium (SiGe). In this case, a silicon concentration in the inner spacer layer 134L may be higher than that in each of the first active pattern 110 and the second active pattern 120. In some embodiments, a silicon concentration in the inner spacer layer 134L may be higher than that in each of the first sacrificial pattern 112 and the second sacrificial pattern 122

For example, when the first active pattern 110 and the second active pattern 120 are silicon germanium (SiGe) or germanium (Ge), the inner spacer layer 134L may include silicon germanium (SiGe) or germanium (Ge). In this case, a germanium concentration in the inner spacer layer 134L may be higher than that in each of the first active pattern 110 and the second active pattern 120. In some embodiments, a germanium concentration in the inner spacer layer 134L may be higher than that in each of the first sacrificial pattern 112 and the second sacrificial pattern 122.

The inner spacer layer 134L may extend along the upper surface of the first fin protrusion 100P, the sidewalls of the first sacrificial pattern 112, the sidewalls of the first active pattern 110, the sidewalls of the second sacrificial pattern 122, and the sidewalls of the second active pattern 120. For example, the inner spacer layer 134L may extend along profiles of the first fin protrusion 100P, the first sacrificial pattern 112, the first active pattern 110, the second sacrificial pattern 122, and the second active pattern 120.

The inner spacer layer 134L may be formed by, e.g., an epitaxial growth process, but is not limited thereto. For example, the inner spacer layer 134L may be formed by a deposition process. The inner spacer layer 134L may be formed of a single layer, but is not limited thereto. In some embodiments, the inner spacer layer 134L may be formed of multiple layers that include a semiconductor material at different concentrations. In some embodiments, the inner spacer layer 134L may include a multiple layered structure in which at least one insulation material layer and at least one semiconductor material layer are sequentially stacked.

Figure 26:
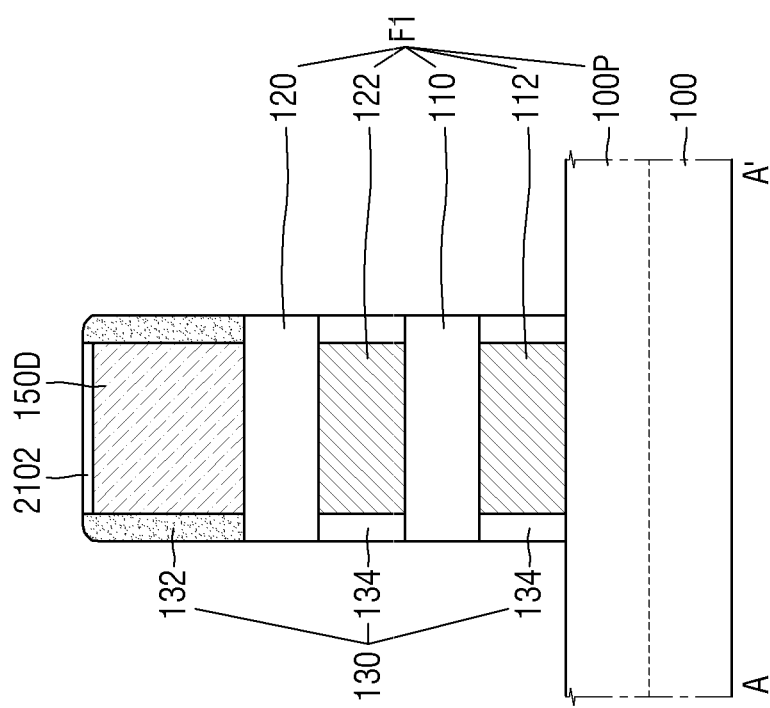

Referring to FIG. 26, a portion of the inner spacer layer 134L on the sidewalls of the first and second active patterns 110 and 120 is removed. Thus, the first gate spacers 130, each of which includes the first outer spacer 132 and the first inner spacer 134, are formed.

The removal process of the portion of the inner spacer layer 134L on the sidewalls of the first and second active patterns 110 and 120 may be performed by an etching process using the dummy gate electrode 150D and the preliminary gate spacers 130P as an etch mask. The above etching process may include, e.g., a gas phase reaction etching process, a plasma etching process, and/or a wet etching process. In addition, by the above etching process, a portion of the inner spacer layer 134L on the upper surface of the first fin protrusion 100P may be removed.

Opposite sidewalls of the first inner spacer 134 may be flat or planar, but are not limited thereto. For example, when the sidewalls of the first sacrificial pattern 112 including the first recess RC1 have the concave curved shape, the sidewall of the first inner spacer 134 adjacent to the first sacrificial pattern 112 may have a convex curved shape. In addition, when the sidewalls of the second sacrificial pattern 122 including the second recess RC2 have the concave curved shape, the sidewall of the first inner spacer 134 adjacent to the second sacrificial pattern 122 may have a convex curved shape.

Figure 27:
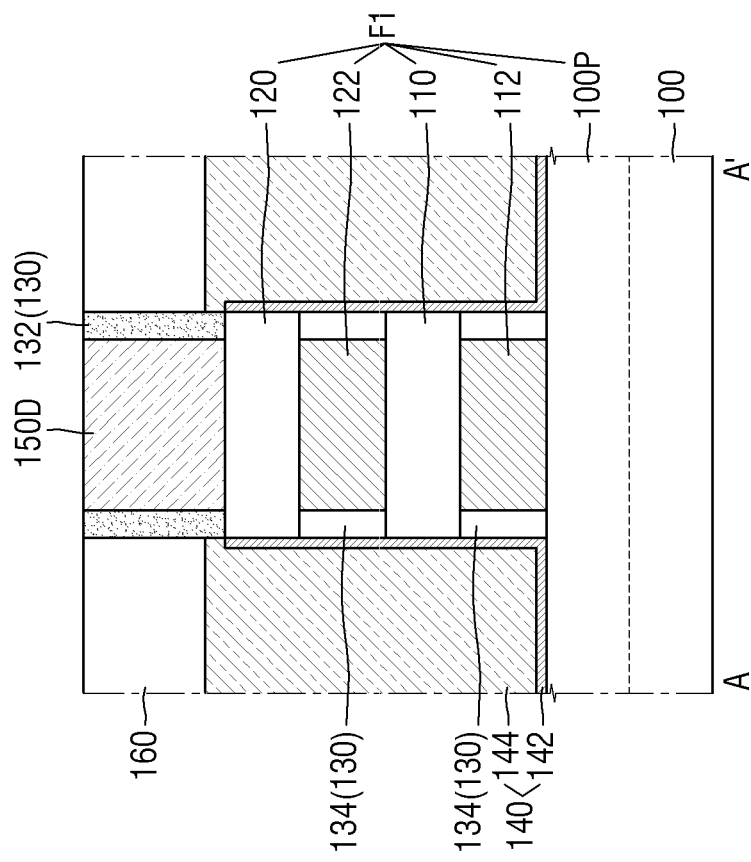

Referring to FIG. 27, the first epitaxial patterns 140 are formed on opposite sides of the dummy gate electrode 150D.

For example, each of the first epitaxial patterns 140 may be formed by being grown from the first fin protrusion 100P, the first active pattern 110, the second active pattern 120, and the first inner spacer 134 using an epitaxial growth process. Thus, each of the first epitaxial patterns 140 may contact the first active pattern 110, the second active pattern 120, and the first inner spacer 134.

In some embodiments, each of the first epitaxial patterns 140 may include multiple layers. For example, each of the first epitaxial patterns 140 may include the first epitaxial layer 142 and the second epitaxial layer 144.

The interlayer insulation layer 160 is formed on the substrate 100 to cover the first epitaxial patterns 140. The dummy gate electrode 150D may be exposed by the interlayer insulation layer 160.

For example, the interlayer insulation layer 160 may be formed to cover the first epitaxial patterns 140 and then may be planarized until an upper surface of the dummy gate electrode 150D is exposed.

The second mask pattern 2102 may be removed during the formation of the interlayer insulation layer 160.

Figure 28:
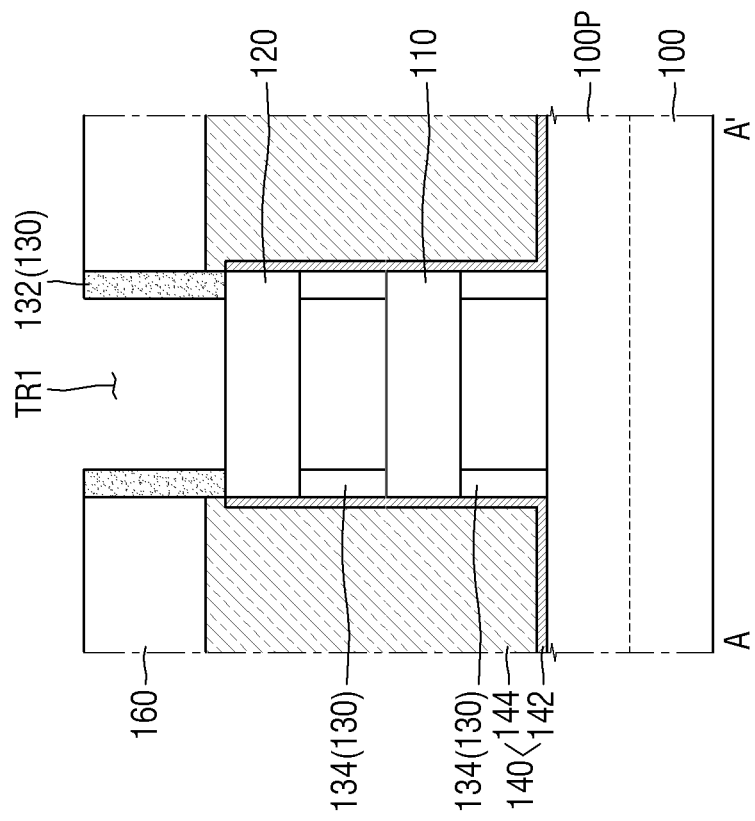
Figure 29:
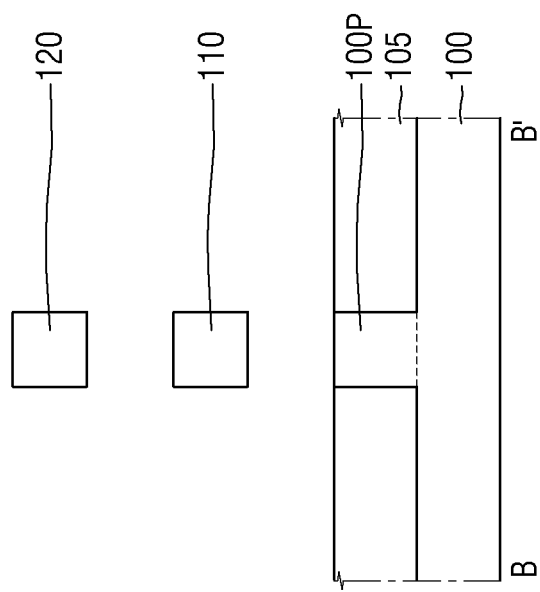

Referring to FIGS. 28 and 29, the dummy gate electrode 150D, the first sacrificial pattern 112, and the second sacrificial pattern 122 are removed. Thus, the first trench TR1 extending lengthwise in the second direction Y1 may be formed. The first active pattern 110 and the second active pattern 120 may also be exposed.

The first active pattern 110 may be spaced apart from the first fin protrusion 100P. The second active pattern 120 may be spaced apart from the first active pattern 110.

Referring again to FIGS. 1 to 4, the first gate insulation layer 152 and the first gate electrode 154 are formed in the first trench TR1.

The first gate electrode 154 may be formed of a single layer, but is not limited to thereto. In some embodiments, the first gate electrode 154 may be formed of multiple layers. For example, the first gate electrode 154 may include a work function control conductive layer and a filling conductive layer in a space formed by the work function control conductive layer.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
 a substrate;
 a gate electrode on the substrate, the gate electrode extending in a first direction;
 a gate spacer on a sidewall of the gate electrode, the gate spacer comprising a semiconductor material layer;
 an active pattern penetrating the gate electrode and the gate spacer, the active pattern extending in a second direction crossing the first direction; and
 an epitaxial pattern contacting the active pattern and the gate spacer, wherein the gate spacer differs in material composition from the epitaxial pattern,
 wherein a silicon concentration in the gate spacer is higher than a silicon concentration in the active pattern,
 wherein a sidewall of the gate spacer, which is adjacent to the gate electrode, has a convex curved shape toward the gate electrode, and
 wherein a width of the gate electrode in the second direction gradually decreases and then increases with distance away from the substrate.

2. The semiconductor device according to claim 1, wherein the semiconductor material layer of the gate spacer comprises silicon and the epitaxial pattern comprises germanium.

3. The semiconductor device according to claim 1, wherein the epitaxial pattern contacts the active pattern at a sidewall thereof, and wherein the sidewall of the active pattern is free of the gate spacer.

4. The semiconductor device according to claim 1, wherein the semiconductor material layer comprises germanium.

5. The semiconductor device according to claim 1, wherein the epitaxial pattern contacts the gate spacer, and wherein the gate spacer is free of an oxide or a nitride.

6. The semiconductor device according to claim 1, wherein the epitaxial pattern comprises a p-type impurity and silicon germanium.

7. The semiconductor device according to claim 6, wherein the epitaxial pattern comprises a first epitaxial pattern and a second epitaxial pattern on the first epitaxial pattern, the first epitaxial pattern contacts the active pattern and the gate spacer, and a germanium concentration in the second epitaxial pattern is higher than a germanium concentration in the first epitaxial pattern.

8. The semiconductor device according to claim 1, wherein the epitaxial pattern comprises a first impurity, and the semiconductor material layer of the gate spacer comprises a second impurity of a same conductive type as the first impurity.

9. The semiconductor device according to claim 1, wherein the epitaxial pattern comprises a first impurity, and
the semiconductor material layer of the gate spacer comprises a second impurity of a different conductive type from the first impurity.

10. A semiconductor device comprising:
a substrate;
a first active pattern on the substrate;
a gate electrode surrounding the first active pattern;
an inner spacer on a sidewall of the gate electrode, wherein the inner spacer is between the first active pattern and the substrate; and
an epitaxial pattern contacting the first active pattern and the inner spacer, wherein each of the inner spacer and the first active pattern differ in material composition from the epitaxial pattern,
wherein a silicon concentration in the inner spacer is higher than a silicon concentration in the first active pattern,
wherein a sidewall of the inner spacer, which is adjacent to the gate electrode, has a convex curved shape toward the gate electrode, and
wherein a width of the gate electrode gradually decreases and then increases with distance away from the substrate.

11. The semiconductor device according to claim 10, further comprising:
an outer spacer on the sidewall of the gate electrode,
wherein the outer spacer is disposed on the first active pattern and the inner spacer.

12. The semiconductor device according to claim 11, wherein the outer spacer comprises an insulating material, and wherein the inner spacer is free of an oxide or a nitride.

13. The semiconductor device according to claim 10, further comprising:
a second active pattern on the first active pattern,
wherein the gate electrode further surrounds the second active pattern, and wherein the first and second active patterns extend through the inner spacer to contact the epitaxial pattern.

14. A semiconductor device comprising:
a substrate comprising a first region and a second region;
a first gate electrode on the first region, the first gate electrode extending in a first direction;
a first gate spacer on a sidewall of the first gate electrode, the first gate spacer comprising a first semiconductor material;
a first active pattern penetrating the first gate electrode and the first gate spacer, the first active pattern extending in a second direction crossing the first direction;
a first epitaxial pattern on a sidewall of the first gate spacer, wherein the first gate spacer differs in material composition from the first epitaxial pattern;
a second gate electrode on the second region, the second gate electrode extending in a third direction;
a second active pattern penetrating the second gate electrode, the second active pattern extending in a fourth direction crossing the third direction; and
a second epitaxial pattern on a sidewall of the second gate electrode,
wherein the first epitaxial pattern contacts the first gate spacer, the first active pattern, and the second active pattern,
wherein a silicon concentration in the first gate spacer is higher than a silicon concentration in the first active pattern,
wherein a sidewall of the first gate spacer, which is adjacent to the first gate electrode, has a convex curved shape, and
wherein a width of the first gate electrode in the second direction gradually decreases and then increases with distance away from the substrate.

15. The semiconductor device according to claim 14, further comprising:
a gate insulation layer between the second gate electrode and the second epitaxial pattern, the gate insulation layer contacting the second epitaxial pattern,
wherein the first epitaxial pattern and the second epitaxial pattern comprise a p-type impurity.

16. The semiconductor device according to claim 14, further comprising:
a second gate spacer between the second epitaxial pattern and the second gate electrode, the second gate spacer contacting the second epitaxial pattern,
wherein the first epitaxial pattern and the second epitaxial pattern comprise an n-type impurity, and
the second gate spacer comprises an insulating material.

17. The semiconductor device according to claim 14, further comprising:
a second gate spacer between the second epitaxial pattern and the second gate electrode, the second gate spacer contacting the second epitaxial pattern,
wherein the first epitaxial pattern comprises a p-type impurity,
the second epitaxial pattern comprises an n-type impurity, and
the second gate spacer comprises an insulating material.

18. The semiconductor device according to claim 14, further comprising:
a second gate spacer between the second epitaxial pattern and the second gate electrode, the second gate spacer contacting the second epitaxial pattern,
wherein the first epitaxial pattern comprises a p-type impurity,
the second epitaxial pattern comprises an n-type impurity, and
the second gate spacer comprises a second semiconductor material.

* * * * *